US011028022B2

(12) United States Patent
Terasaki

(10) Patent No.: US 11,028,022 B2
(45) Date of Patent: Jun. 8, 2021

(54) COPPER-CERAMIC BONDED BODY AND INSULATION CIRCUIT SUBSTRATE

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/312,479

(22) PCT Filed: Jun. 28, 2017

(86) PCT No.: PCT/JP2017/023729
§ 371 (c)(1),
(2) Date: Dec. 21, 2018

(87) PCT Pub. No.: WO2018/003845
PCT Pub. Date: Jan. 4, 2018

(65) Prior Publication Data
US 2019/0135706 A1 May 9, 2019

(30) Foreign Application Priority Data

Jun. 30, 2016 (JP) .............................. JP2016-130224
Jun. 19, 2017 (JP) .............................. JP2017-119683

(51) Int. Cl.
*B32B 9/00* (2006.01)
*C04B 37/02* (2006.01)
(Continued)

(52) U.S. Cl.
CPC .......... *C04B 37/021* (2013.01); *C04B 37/025* (2013.01); *C04B 37/026* (2013.01);
(Continued)

(58) Field of Classification Search
None
See application file for complete search history.

(56) References Cited

U.S. PATENT DOCUMENTS

| 2009/0056996 A1* | 3/2009 | Kato | ........................ H01L 24/29 174/260 |
| 2015/0208496 A1 | 7/2015 | Terasaki et al. | |
| 2016/0221305 A1 | 8/2016 | Terasaki et al. | |

FOREIGN PATENT DOCUMENTS

| JP | 01-251781 A | 10/1989 |
| JP | H05-148053 A | 6/1993 |
| JP | H06-024854 A | 2/1994 |
| JP | 3211856 B2 | 9/2001 |
| JP | 2015-092552 A | 5/2015 |

(Continued)

OTHER PUBLICATIONS

MG Nicholas, "The Brazing of Ceramics", 1998, Kluwer Academic Publishers, Interfacial Science in Ceramic Joining, p. 97-109. (Year: 1998).*

(Continued)

*Primary Examiner* — Seth Dumbris
*Assistant Examiner* — Kim S. Horger
(74) *Attorney, Agent, or Firm* — Locke Lord LLP; James E. Armstrong, IV; Nicholas J. DiCeglie, Jr.

(57) ABSTRACT

In a copper-ceramic bonded body of the present invention, at a bonding interface of a copper member and a ceramic member, there are formed a nitride compound layer containing one or more nitride forming elements selected from Ti, Nb, Hf, and Zr, and an Ag—Cu eutectic layer, in order from the ceramic member side, the thickness of the nitride compound layer is 0.15 μm or more and 1.0 μm or less, an intermetallic compound phase formed of an intermetallic compound that contains the nitride forming element and Si is present between the copper member and the ceramic member, and Cu and Si are present at the grain boundary of the nitride compound layer.

6 Claims, 12 Drawing Sheets

(51) Int. Cl.
- *H01L 21/48* (2006.01)
- *H01L 23/367* (2006.01)
- *H01L 23/373* (2006.01)
- *H01L 23/00* (2006.01)
- *H01L 23/473* (2006.01)
- *H01L 23/40* (2006.01)
- *H01L 23/36* (2006.01)

(52) U.S. Cl.
CPC ...... *H01L 21/4871* (2013.01); *H01L 23/3672* (2013.01); *H01L 23/3735* (2013.01); *H01L 24/32* (2013.01); *C04B 2237/08* (2013.01); *C04B 2237/09* (2013.01); *C04B 2237/124* (2013.01); *C04B 2237/125* (2013.01); *C04B 2237/127* (2013.01); *C04B 2237/368* (2013.01); *C04B 2237/407* (2013.01); *C04B 2237/50* (2013.01); *C04B 2237/59* (2013.01); *C04B 2237/60* (2013.01); *C04B 2237/708* (2013.01); *C04B 2237/72* (2013.01); *H01L 23/36* (2013.01); *H01L 23/4006* (2013.01); *H01L 23/473* (2013.01); *H01L 2224/32225* (2013.01)

(56) References Cited

FOREIGN PATENT DOCUMENTS

| JP | 2015-185705 A | 10/2015 |
| TW | 353220 B | 2/1999 |
| WO | 2013/115359 A1 | 8/2013 |
| WO | WO-2015046280 A1 * | 4/2015 |

OTHER PUBLICATIONS

RE Loehman et al., "Bonding Mechanisms in Silicon Nitride Brazing", 1990, Journal of the American Ceramic Society, 73 (3), p. 552-558. (Year: 1990).*

Chemical Book, "9004-57-3(Ethyl cellulose) Product Description", copyrighted 2017, ChemicalBook, accessed online Jun. 8, 2020 at www.chemicalbook.com/ChemicalProductProperty_US_CB6165620.aspx (Year: 2017).*

International Search Report dated Sep. 12, 2017, issued for PCT/JP2017/023729 and English translation thereof.

Extended European Search Report issued in corresponding European Patent Application No. EP 17820199.2, dated Jan. 8, 2020.

Office Action issued in corresponding Taiwanese Patent Application No. TW 106122078, dated Sep. 23, 2020.

* cited by examiner

COPPER-CERAMIC BONDED BODY AND INSULATION CIRCUIT SUBSTRATE

TECHNICAL FIELD

The present invention relates to a copper-ceramic bonded body formed by bonding a copper member formed of copper or a copper alloy and a ceramic member formed of silicon nitride, and an insulation circuit substrate in which a copper layer formed of copper or a copper alloy is formed on a surface of a ceramic substrate formed of silicon nitride.

Priority is claimed on Japanese Patent Application No. 2016-130224 filed on Jun. 30, 2016, and Japanese Patent Application No. 2017-119683, filed on Jun. 19, 2017, the contents of which are incorporated herein by reference.

BACKGROUND ART

A semiconductor device such as an LED or a power module has a structure in which a semiconductor element is bonded onto a circuit layer formed of a conductive material.

In a power semiconductor element for controlling the high power used for controlling wind power generation, electric cars, and hybrid cars, since the power semiconductor element generates a large amount of heat, an insulation circuit substrate including a ceramic substrate formed of, for example, aluminum nitride (AlN), alumina ($Al_2O_3$), silicon nitride ($Si_3N_4$) or the like, and a circuit layer formed by bonding a metal plate having excellent conductivity to one surface of this ceramic substrate has been widely used as a substrate for mounting the power semiconductor element in the related art. A substrate in which a metal layer is formed by bonding the metal plate to the other surface of the ceramic substrate is also provided an insulation circuit substrate. Here, a ceramic substrate formed of silicon nitride ($Si_3N_4$) is particularly excellent in strength.

For example, Patent Document 1 proposes an insulation circuit substrate in which a first metal plate and a second metal plate that constitute a circuit layer and a metal layer are set as copper plates and the copper plates are directly bonded to a ceramic substrate by a direct bonded copper (DBC) method. In this DBC method, the generation of liquid phases is caused at interfaces of the copper plates and the ceramic substrate using a eutectic reaction between copper and a copper oxide, and the copper plates and the ceramic substrate are bonded.

In addition, Patent Document 2 proposes an insulation circuit substrate in which a circuit layer and a metal layer are formed by bonding copper plates to one surface and the other surface of a ceramic substrate. In this insulation circuit substrate, the copper plates are arranged on one surface and the other surface of the ceramic substrate with an Ag—Cu—Ti-based brazing filler material interposed therebetween and the copper plates are bonded to one surface and the other surface of the ceramic substrate by performing heating treatment (so-called an active metal brazing method). In this active metal brazing method, since a brazing filler material containing Ti which is an active metal is used, wettability of a melted brazing filler material and the ceramic substrate is improved and the ceramic substrate and the copper plates are favorably bonded.

CITATION LIST

Patent Literature

[Patent Document 1] Japanese Unexamined Patent Application, First Publication No. H01-251781
[Patent Document 2] Japanese Patent No. 3211856

DISCLOSURE OF INVENTION

Technical Problem

However, as disclosed in Patent Document 1, in a case of bonding the ceramic substrate and the copper plates by the DBC method, it is necessary to set a bonding temperature to equal to or higher than 1065° C. (equal to or higher than an eutectic point temperature of copper and a copper oxide), and accordingly, the ceramic substrate may be deteriorated at the time of bonding.

In addition, as disclosed in Patent Document 2, in a case of bonding the ceramic substrate and the copper plates by the active metal brazing method using an Ag—Cu—Ti-based brazing filler material or the like, the bonding temperature is set as a comparatively high temperature which is 900° C., and accordingly, there is a problem that the ceramic substrate is deteriorated. Here, in a case where the bonding temperature is simply decreased, the brazing filler material does not sufficiently react with the ceramic substrate such that a decrease in a bonding rate is caused at the interfaces of the ceramic substrate and the copper plates, and an insulation circuit substrate having high reliability cannot be provided.

Further, in a case where the bonding temperature at the time of bonding using the Ag—Cu—Ti-based brazing filler material is high, a thick nitride compound layer (titanium nitride layer) is formed at the bonding interfaces, and there is a problem that cracks may be generated in the nitride compound layer (titanium nitride layer).

The present invention is made in consideration of the above-described circumstances and an object of the present invention is to provide a copper-ceramic bonded body with high reliability in which generation of cracks in a nitride compound layer can be suppressed and a copper member and a ceramic member formed of silicon nitride are reliably bonded, and an insulation circuit substrate including the copper-ceramic bonded body.

Solution to Problem

In order to solve the aforementioned problems and achieve the object, there is provided a copper-ceramic bonded body according to the present invention in which a copper member formed of copper or a copper alloy and a ceramic member formed of silicon nitride are bonded, at a bonding interface of the copper member and the ceramic member, a nitride compound layer including one or more nitride forming elements selected from Ti, Nb, Hf, and Zr, and an Ag—Cu eutectic layer are formed in order from the ceramic member side, a thickness of the nitride compound layer is 0.15 μm or more and 1.0 μm or less, an intermetallic compound phase formed of an intermetallic compound that contains the nitride forming element and Si is present between the copper member and the ceramic member, and Cu and Si are present at a grain boundary of the nitride compound layer.

In the copper-ceramic bonded body with this configuration, since the Ag—Cu eutectic layer is formed at the bonding interface of the copper member and the ceramic member and the intermetallic compound phase formed of the intermetallic compound that contains the nitride forming element and Si is present between the copper member and the ceramic member, a decomposition reaction sufficiently occurs at the bonding surface of the ceramic substrate formed of silicon nitride and a copper-ceramic bonded body in which the copper member and the ceramic member are reliably bonded can be obtained. The intermetallic compound phase may be present in the Ag—Cu eutectic layer or may be present to be adjacent to the nitride compound layer including one or two or more nitride forming elements selected from Ti, Nb, Hf, and Zr. In addition, the intermetallic compound phase may be present within 20 µm from the bonding interface of the copper member and the ceramic member to the copper member.

Further, since the nitride compound layer having a thickness of 0.15 µm or more and 1.0 µm or less is formed between the Ag—Cu eutectic layer and the ceramic member and Cu and Si are present at the grain boundary of the nitride compound layer, the generation of cracks in the nitride compound layer can be suppressed and a copper-ceramic bonded body with high bonding strength can be obtained without generating unreacted portions at the bonding interface of the copper member and the ceramic member.

Here, in the copper-ceramic bonded body of the present invention, it is preferable that Ag particles are dispersed in the nitride compound layer.

It is assumed that the Ag particles are formed in a process of forming the nitride compound layer by a reaction between the nitride forming element and nitrogen. Thus, since the Ag particles are dispersed in the nitride compound layer, the aforementioned nitride compound layer is sufficiently formed and a copper-ceramic bonded body in which the copper member and the ceramic member are reliably bonded can be obtained.

In the copper-ceramic bonded body of the present invention, a particle diameter of the Ag particles dispersed in the nitride compound layer may be in a range of 10 nm or more and 100 nm or less.

In this case, since the Ag particles dispersed in the nitride compound layer have a relatively fine particle diameter in a range of 10 nm or more and 100 nm or less and are formed in a process of forming the nitride compound layer by the reaction between the nitride forming element and nitrogen (N), formation of a nitride including the nitride forming element is promoted and the nitride compound layer is sufficiently formed. Thus, a copper-ceramic bonded body in which the copper member and the ceramic member are reliably bonded can be obtained.

In the copper-ceramic bonded body of the present invention, it is preferable that a ratio C2/C1 between an average Ag concentration C1 in a region from an interface close to the ceramic member to a 25% thickness position of a total thickness and an average Ag concentration C2 in a region from an interface close to the copper member to a 25% thickness position of the total thickness in the nitride compound layer is 0.8 or less.

In this case, since the concentration of Ag on the ceramic member side is higher than the concentration of Ag on the copper member side in the nitride compound layer, the interface reaction sufficiently proceeds and a copper-ceramic bonded body in which the copper member and the ceramic member are reliably bonded can be obtained.

There is provided an insulation circuit substrate according to the present invention in which a copper layer formed of copper or a copper alloy is formed on a surface of a ceramic substrate formed of silicon nitride, and the copper layer and the ceramic substrate are formed of the copper-ceramic bonded body.

According to the insulation circuit substrate having this configuration, since the copper layer and the ceramic substrate are formed of the copper-ceramic bonded body, the ceramic substrate and the copper plate are reliably bonded and the bonding reliability can be secured. The copper layer bonded to the surface of the ceramic substrate is used to constitute a circuit layer or a metal layer.

Advantageous Effects of Invention

According to the present invention, it is possible to provide a copper-ceramic bonded body with high reliability in which the generation of cracks in a nitride compound layer can be suppressed and a copper member formed of copper or a copper alloy and a ceramic member formed of silicon nitride are reliably bonded, and an insulation circuit substrate including the copper-ceramic bonded body.

BEST MODE FOR CARRYING OUT THE INVENTION

Hereinafter, embodiments of the present invention will be described with reference to the accompanied drawings. In the following description, the term "brazing filler material" is not necessarily limited to a material including lead.

First Embodiment

First, a first embodiment of the present invention will be described with reference to FIGS. 1 to 6.

A copper-ceramic bonded body according to the embodiment is an insulation circuit substrate 10 formed by bonding a ceramic substrate 11 which is a ceramic member and a copper plate 22 (circuit layer 12) which is a copper member.

Figure 1:
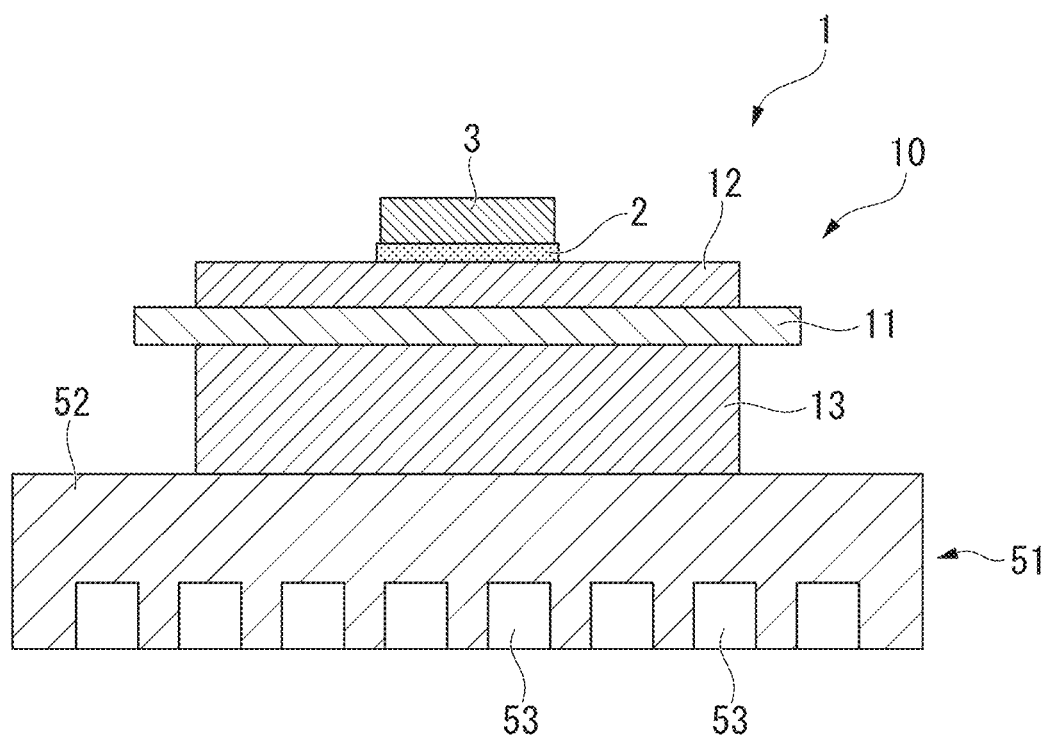
FIG. 1 is a schematic explanatory diagram of a power module using an insulation circuit substrate of a first embodiment of the present invention.

FIG. 1 shows the insulation circuit substrate 10 of the first embodiment of the present invention and a power module 1 using this insulation circuit substrate 10.

The power module 1 includes the insulation circuit substrate 10, a semiconductor element 3 bonded to one surface side (upper side in FIG. 1) of the insulation circuit substrate 10 through a solder layer 2, and a heat sink 51 which is arranged on the other surface side (lower side in FIG. 1) of the insulation circuit substrate 10.

Here, the solder layer 2 is, for example, a Sn—Ag-based, a Sn—In-based or Sn—Ag—Cu-based soldering material.

The insulation circuit substrate 10 includes the ceramic substrate 11, the circuit layer 12 arranged on one surface (upper surface in FIG. 1) of the ceramic substrate 11, and a metal layer 13 arranged on the other surface (lower surface in FIG. 1) of the ceramic substrate 11.

The ceramic substrate 11 prevents electric connection between the circuit layer 12 and the metal layer 13 and is formed of silicon nitride ($Si_3N_4$) having high insulating properties in the embodiment. Herein, a thickness of the ceramic substrate 11 is preferably set in a range of 0.2 mm to 1.5 mm and is set to 0.32 mm in the embodiment.

Figure 5:
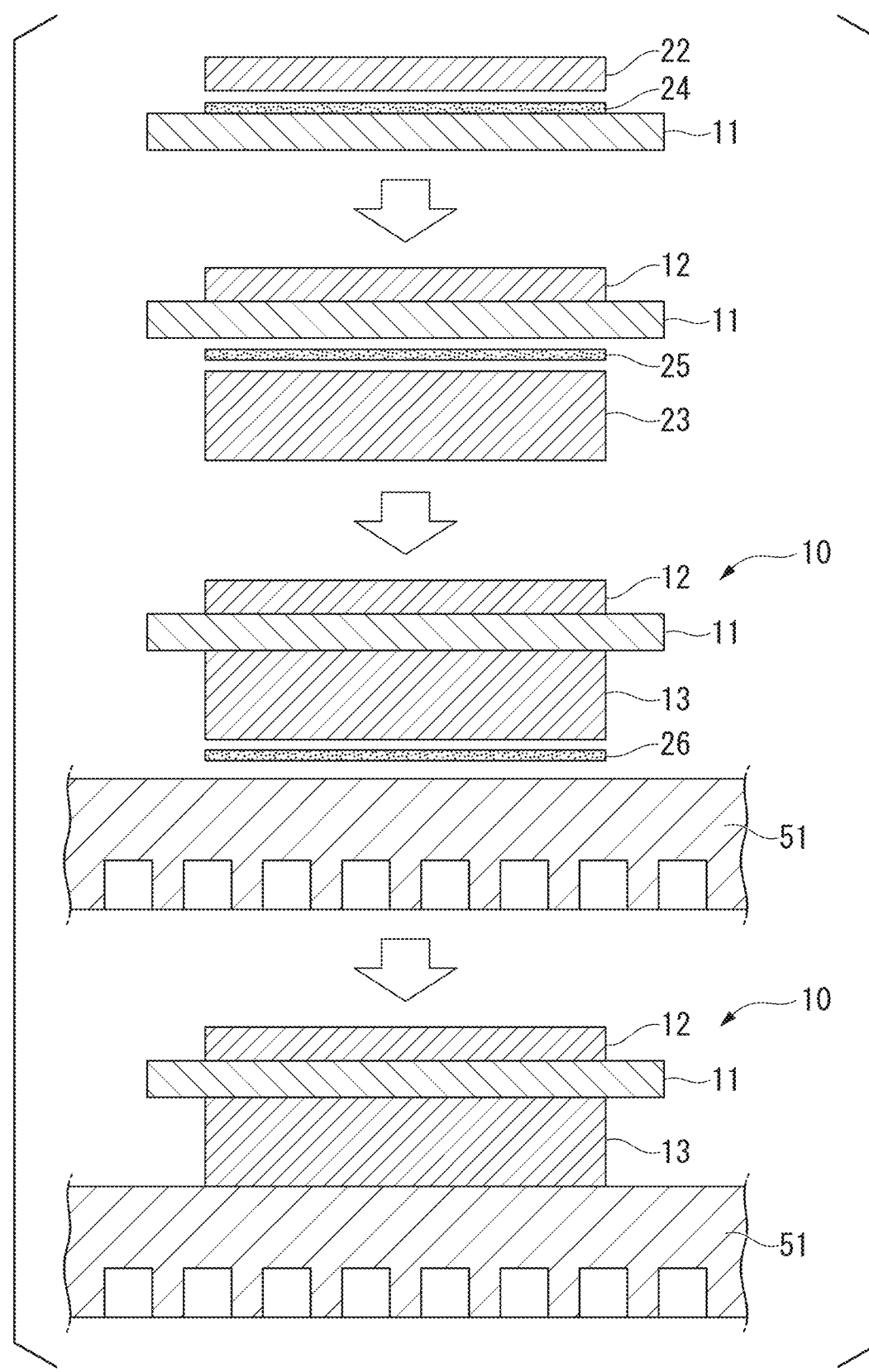
FIG. 5 is an explanatory diagram showing the method of manufacturing the insulation circuit substrate of the first embodiment of the present invention.

As shown in FIG. 5, the circuit layer 12 is formed by bonding the copper plate 22 formed of copper or a copper alloy to one surface of the ceramic substrate 11. As the copper or the copper alloy, oxygen-free copper, tough pitch copper, and the like can be used. In the embodiment, a rolled sheet of oxygen-free copper is used as the copper plate 22 constituting the circuit layer 12. A circuit pattern is formed in this circuit layer 12 and the one surface (upper surface in FIG. 1) is set as a mounted surface where the semiconductor element 3 is mounted. Herein, a thickness of the circuit layer 12 is preferably set in a range of 0.1 mm or more and 3.0 mm or less and is set to 0.6 mm in the embodiment.

As shown in FIG. 5, the metal layer 13 is formed by bonding an aluminum plate 23 to the other surface of the ceramic substrate 11. In the embodiment, the metal layer 13 is formed by bonding the aluminum plate 23 formed of a rolled sheet of aluminum having purity of 99.99 mass % or higher (so-called 4 N aluminum) to the ceramic substrate 11. A 0.2% bearing force of the aluminum plate 23 is preferably 30 $N/mm^2$ or less. Here, a thickness of the metal layer 13 (aluminum plate 23) is preferably set in a range of 0.1 mm or more and 6 mm or less and is set to 2.0 mm in the embodiment.

The heat sink 51 is for cooling the aforementioned insulation circuit substrate 10 and includes a top plate portion 52 which is bonded to the insulation circuit substrate 10 and flow paths 53 through which a cooling medium (for example, cooling water) is circulated. The heat sink 51 (top plate portion 52) is preferably formed of a material having excellent thermal conductivity and is formed of A6063 (aluminum alloy) in the embodiment.

In the embodiment the heat sink 51 (top plate portion 52) is directly bonded to the metal layer 13 of the insulation circuit substrate 10 using a brazing filler material.

Figure 2:
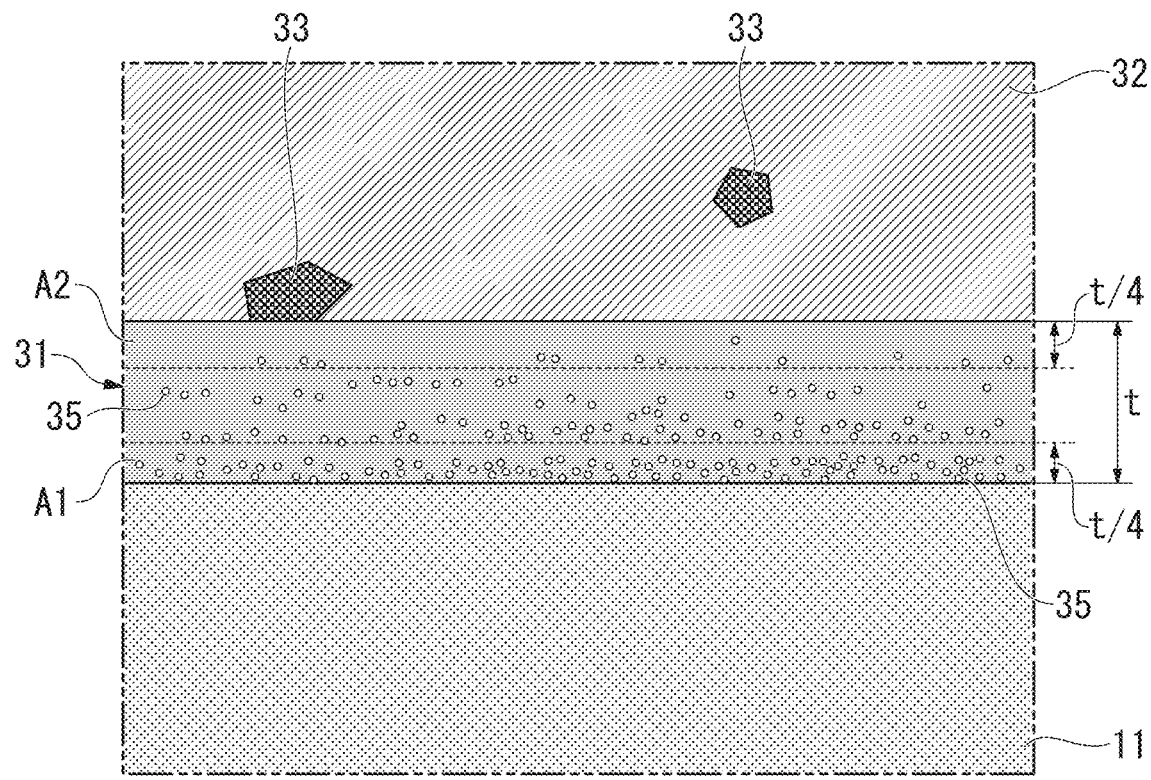
FIG. 2 is a schematic view of a bonding interface of a circuit layer (copper member) and a ceramic substrate (ceramic member) of the insulation circuit substrate of the first embodiment of the present invention.

Here, as shown in FIG. 5, the ceramic substrate 11 and the circuit layer 12 (copper plate 22) are bonded using a brazing filler material including Ag, Cu, and one or two or more nitride forming elements selected from Ti, Nb, Hf, and Zr (Ag—Cu—Ti-based brazing filler material 24 including Ti as the nitride forming element in the embodiment). A nitride compound layer 31 and an Ag—Cu eutectic layer 32 are formed at the bonding interface of the ceramic substrate 11 and the circuit layer 12 (copper plate 22) as shown in FIG. 2.

In addition, an intermetallic compound phase 33 formed of an intermetallic compound including a nitride forming element (Ti in the embodiment) and Si is present between the circuit layer 12 (copper plate 22) and the ceramic substrate 11. In the embodiment, the intermetallic compound phase 33 is formed of $Ti_5Si_3$.

Figure 3:
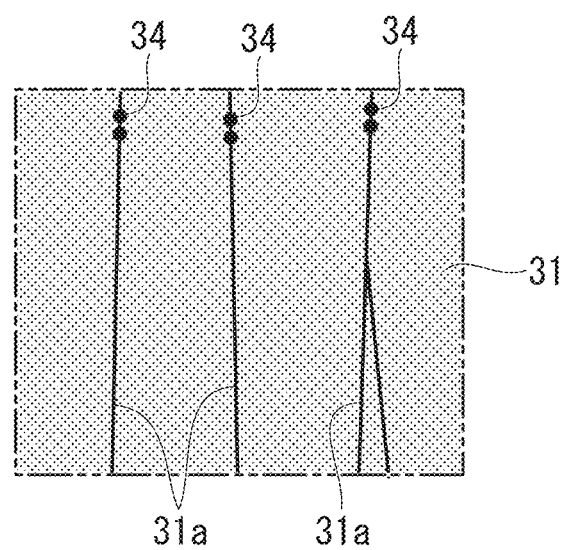
FIG. 3 is an enlarged explanatory diagram of a nitride compound layer shown in FIG. 2.

Then, as shown in FIG. 3, the aforementioned nitride compound layer 31 has a columnar crystal structure and Cu and Si 34 are present at a grain boundary 31a of the columnar crystal. The Cu and Si 34 present at a grain boundary 31a of the nitride compound layer 31 can be detected by the element mapping of Cu and Si with a beam diameter of about 0.1 nm through observation using a transmission electron microscope (Titan Chem iSTEM manufactured by FEI Company) at an acceleration voltage of 200 kV and a magnification of 910000 times.

Here, a thickness t of the nitride compound layer 31 is set to 0.15 μm or more and 1.0 m or less. The thickness t of the nitride compound layer 31 is preferably set to 0.4 μm or more and 0.8 μm or less.

Ag particles 35 are dispersed in the nitride compound layer 31. A large amount of Ag particles 35 is distributed in the nitride compound layer 31 on the side close to the ceramic substrate 11, and the concentration of Ag in a near interface region from the interface with the ceramic substrate 11 to 500 nm in the nitride compound layer 31 is 0.3 atomic % or more and preferably set to be in a range from 0.3 atomic % to 15 atomic %. In the embodiment, 90% or more (number ratio) of the Ag particles 35 observed in the nitride compound layer 31 is distributed in the aforementioned near interface region. The ratio of the Ag particles 35 distributed in the aforementioned near interface region is preferably 95% or more and the upper limit is 100%. However, the embodiment is not limited thereto.

In addition, in the embodiment, the particle diameter of the Ag particles 35 dispersed in the nitride compound layer 31 is set to be in a range of 10 nm or more and 100 nm or less. The particle diameter of the Ag particles 35 may be set to be in a range of 10 nm or more and 50 nm or less.

Here, in the embodiment, as shown in FIG. 2, in the nitride compound layer 31, a ratio C2/C1 between an average Ag concentration C1 in a region A1 from the interface close to the ceramic substrate 11 (the interface with the ceramic substrate 11) to a 25% thickness position of the total thickness t of the nitride compound layer 31 and an average Ag concentration C2 in a region A2 from the interface close to the copper plate 22 (circuit layer 12) to a 25% thickness position of the total thickness t of the nitride compound layer 31 is preferably 0.8 or less. In addition, the lower limit of C2/C1 is 0 and is preferably 0.01.

In the embodiment, as shown in FIG. 2, since the Ag—Cu eutectic layer 32 is formed on the surface of the nitride compound layer 31 close to the circuit layer 12 (copper plate 22), the aforementioned "the interface of the nitride compound layer 31 close to the copper plate 22 (circuit layer 12)" becomes an interface with the Ag—Cu eutectic layer 32.

Next, a method of manufacturing the insulation circuit substrate 10 of the aforementioned embodiment will be described with reference to FIGS. 4 to 6.

(Copper Plate Lamination Step S01)

Figure 4:
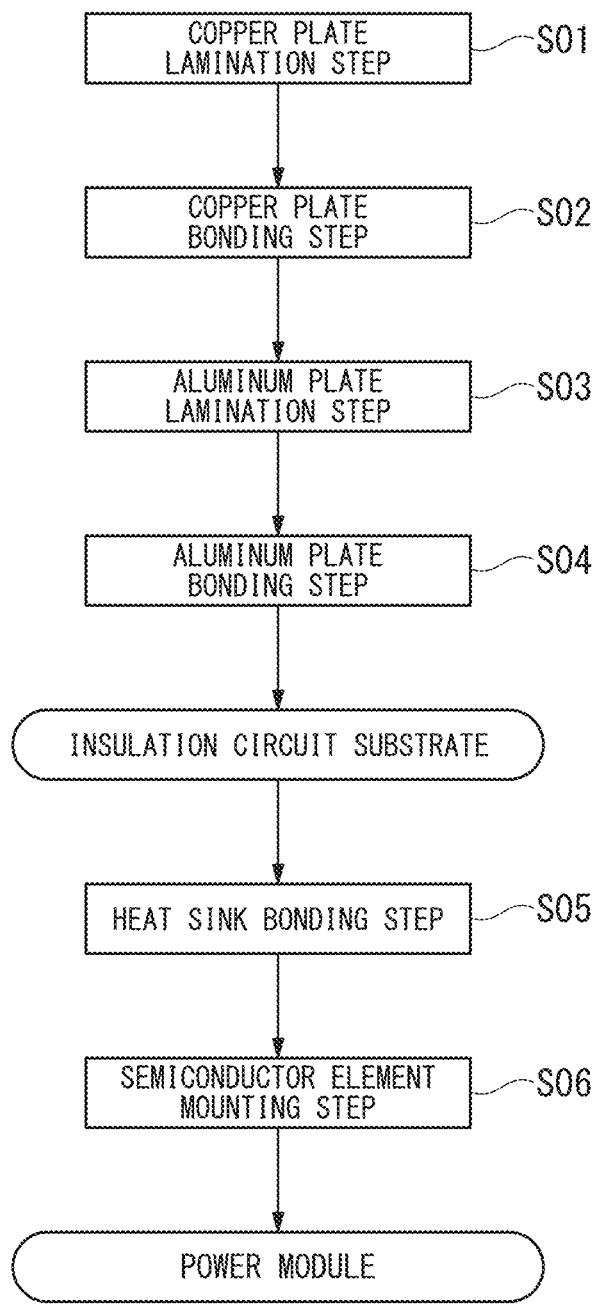
FIG. 4 is a flowchart showing a method of manufacturing the insulation circuit substrate of the first embodiment of the present invention.

First, as shown in FIGS. 4 and 5, the copper plate 22 which becomes the circuit layer 12 is laminated on one surface of the ceramic substrate 11 with a brazing filler material including Ag, Cu, and one or two or more nitride forming elements selected from Ti, Nb, Hf, and Zr (in the embodiment, the Ag—Cu—Ti-based brazing filler material 24 including Ti as the nitride forming element) interposed therebetween.

Here, in the Ag—Cu—Ti-based brazing filler material 24, the Cu content is preferably 18 mass % or more and 34 mass % or less, and the Ti content is preferably 0.3 mass % or more and 7 mass % or less. However, the embodiment is not limited thereto. In the embodiment, as the Ag—Cu—Ti-based brazing filler material 24, a foil is used and the thickness may be set to be in a range of 3 μm or more and 50 μm or less.

(Copper Plate Bonding Step S02)

Next, the ceramic substrate 11 and the copper plate 22 are put in a heating furnace in vacuum or an argon atmosphere and is heated in a state in which the ceramic substrate and the copper plate are compressed in a lamination direction under pressure in range of 0.5 kgf/cm$^2$ or more and 35 kgf/cm$^2$ or less (4.9×10$^4$ Pa or higher and 343×10$^4$ Pa or lower) to bond the copper plate 22 and the ceramic substrate 11.

Here, in the copper plate bonding step S02, the heating rate, the holding temperature, the holding time, the cooling rate and the like are defined such that a temperature integration value calculated by adding up the values obtained by multiplying the temperature at a Cu—Si eutectic temperature (804° C.) or higher by time is set to be in a range of 180° C.·min or higher and 3501° C.·min or lower (preferably 180° C.·min or higher and 3500° C.·min or lower). In addition, in a case where the bonding temperature is higher than 850° C., a Cu—Ti intermetallic compound forming reaction excessively proceeds and cracks may be generated in the ceramic substrate 11. Therefore, the upper limit of the bonding temperature is preferably set to 850° C.

The lower limit of the aforementioned temperature integration value is preferably set to 250° C.·min and more preferably set to 500° C.·min. In addition, the upper limit of the aforementioned temperature integration value is preferably set to 1900° C.·min and more preferably set to 1700° C.·min.

Figure 6:
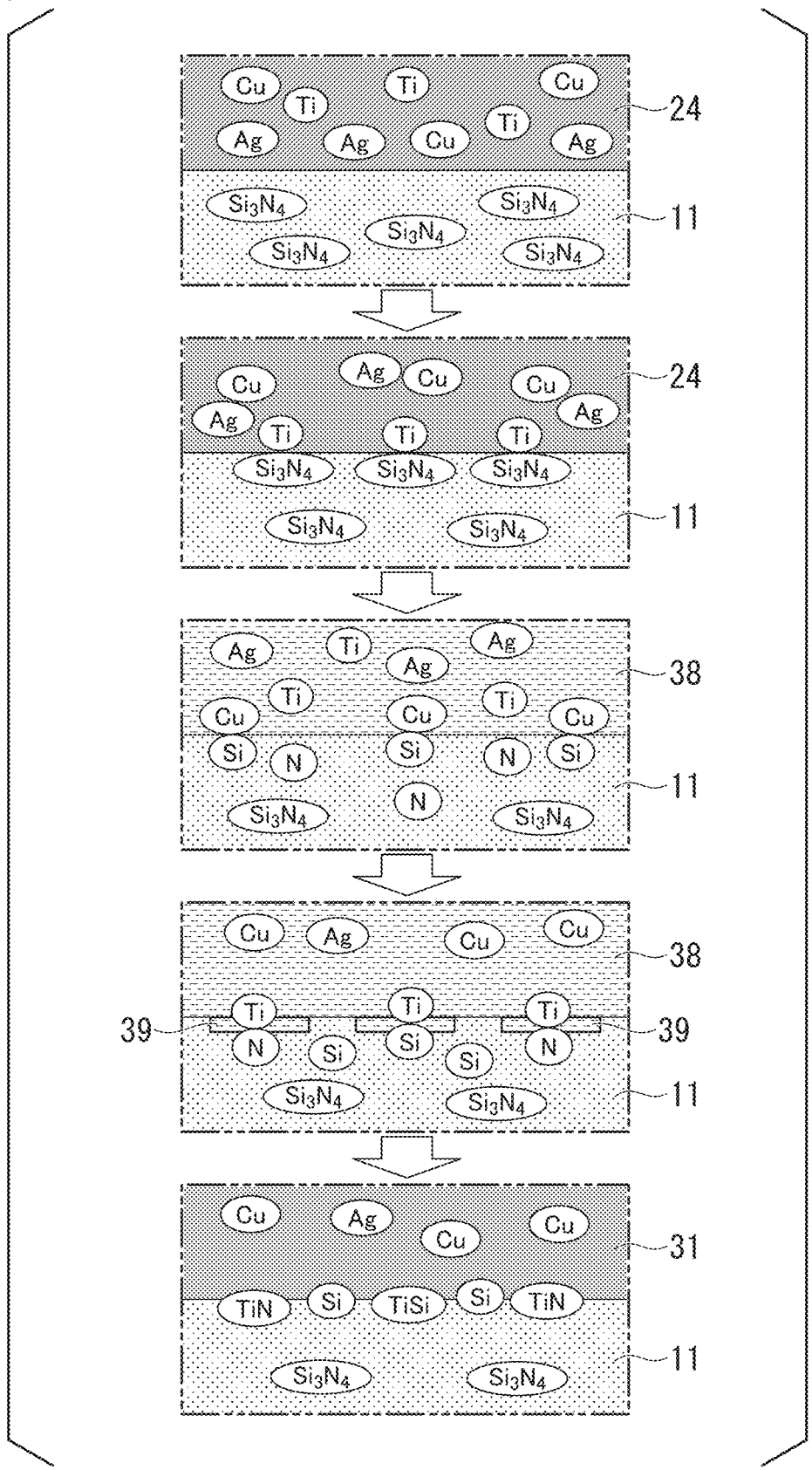
FIG. 6 is a schematic explanatory diagram showing a process of forming a nitride compound layer and an intermetallic compound phase.

In the copper plate bonding step S02, since the temperature integration value calculated by adding up the values obtained by multiplying the temperature at a Cu—Si eutectic temperature (804° C.) or higher by time is set to be in the above range, as shown in FIG. 6, an Ag—Cu eutectic liquid phase 38 is formed by an eutectic reaction between Ag and Cu, Si is formed by a reaction between the nitride forming element (Ti) in the Ag—Cu—Ti-based brazing filler material 24 and the ceramic substrate 11 formed of Si$_3$N$_4$ at the interface with the ceramic substrate 11 in the Ag—Cu eutectic liquid phase 38, and a Cu—Si eutectic liquid phase 39 is formed by an eutectic reaction between this Si and Cu in the Ag—Cu—Ti-based brazing filler material 24. In the Cu—Si eutectic liquid phase 39, Ti in the Ag—Cu—Ti-based brazing filler material 24 and nitrogen (N) in the ceramic substrate 11 react with each other to produce titanium nitride. Thus, the nitride compound layer 31 is formed in a form that the surface of the ceramic substrate 11 is eroded.

Further, Si in the ceramic substrate 11 and the nitride forming element (Ti) in the Ag—Cu—Ti-based brazing filler material 24 react with each other to form the intermetallic compound phase 33 formed of an intermetallic compound including a nitride forming element (Ti in the embodiment) and Si.

In addition, Cu and Si 34 are present at the grain boundary of the nitride compound layer 31 growing as columnar crystals by the above reaction.

Further, in the nitride compound layer 31, the Ag particles 35 are dispersed.

(Aluminum Plate Lamination Step S03)

Next, the aluminum plate 23 which becomes metal layer 13 is laminated on the other surface side of the ceramic substrate 11 with a brazing filler material 25 interposed therebetween. At this time, as the brazing filler material 25, for example, an Al—Si-based brazing filler material foil can be used.

(Aluminum Plate Bonding Step S04)

Next, the ceramic substrate 11 and the aluminum plate 23 are put in a heating furnace in vacuum or an argon atmosphere and is heated in a state in which the ceramic substrate and the copper plate are compressed in the lamination direction under pressure in a range of 1 kgf/cm$^2$ or more and 35 kgf/cm$^2$ or less (9.8×10$^4$ Pa or higher and 343×10$^4$ Pa or lower) to bond the aluminum plate 23 and the ceramic substrate 11.

At this time, the brazing temperature is preferably set to be in a range of 600° C. or higher and 650° C. or lower, and the holding time is preferably set to be in a range of 15 min or longer and 120 min or shorter.

Through the above steps, the insulation circuit substrate 10 of the embodiment is manufactured.

(Heat Sink Bonding Step S05)

Next, the heat sink 51 is bonded to the other surface side of the metal layer 13 of the insulation circuit substrate 10.

The insulation circuit substrate 10 and the heat sink 51 are laminated with a brazing filler material 26 interposed therebetween, compressed in the lamination direction, and put in a vacuum furnace to perform brazing. Thus, the metal layer 13 of the insulation circuit substrate 10 and the top plate portion 52 of the heat sink 51 are bonded. At this time, as the brazing filler material 26, for example, an Al—Si-based brazing filler material foil having a thickness of 20 to 110 μm can be used, and the brazing temperature is preferably set to a temperature lower than the brazing temperature in the aluminum bonding step S04.

(Semiconductor Element Mounting Step S06)

Next, the semiconductor element 3 is bonded to one surface of the circuit layer 12 of the insulation circuit substrate 10 by soldering.

Through the above steps, the power module 1 shown in FIG. 1 is produced.

According to the insulation circuit substrate 10 (copper-ceramic bonded boy) having the above-described configuration, since the Ag—Cu eutectic layer 32 is formed at the bonding interface of the copper plate 22 (circuit layer 12) formed of oxygen-free copper and the ceramic substrate 11 formed of silicon nitride (Si$_3$N$_4$), and the intermetallic compound phase 33 formed of the intermetallic compound including a nitride forming element (Ti in the embodiment) and Si is formed between the copper plate 22 (circuit layer 12) and the ceramic substrate 11 formed of silicon nitride (Si$_3$N$_4$), a decomposition reaction sufficiently occurs on the bonding surface of the ceramic substrate 11, and thus the insulation circuit substrate 10 in which the copper plate 22 (circuit layer 12) and the ceramic substrate 11 are reliably bonded can be obtained.

Further, since the nitride compound layer 31 formed of nitride including a nitride forming element (Ti in the embodiment) is formed and Cu and Si 34 are present at the grain boundary of the nitride compound layer 31 in the embodiment, the generation of cracks in the nitride compound layer 31 can be suppressed.

In addition, since the thickness of the nitride compound layer 31 is set to 0.15 μm or more, the insulation circuit substrate 10 with high bonding strength can be obtained without generating unreacted portions at the bonding interface of the copper plate 22 (circuit layer 12) and the ceramic substrate 11 formed of silicon nitride ($Si_3N_4$). Further, since the thickness of the nitride compound layer 31 is set to 1.0 μm or less, the generation of cracks in the nitride compound layer 31 can be suppressed and the insulation circuit substrate 10 with high bonding strength can be obtained. The intermetallic compound phase 33 may be present in the Ag—Cu eutectic layer 32 or may be present to be adjacent to the nitride compound layer 31. In addition, the intemetallic compound phase 33 may be present within 20 μm from the bonding interface of the copper plate 22 (circuit layer 12) and the ceramic substrate 11 to the copper plate 22 (circuit layer 12).

Further, since the Ag particles 35 are dispersed in the nitride compound layer 31 in the embodiment, the nitride compound layer 31 is sufficiently formed at the time of bonding and the copper plate 22 (circuit layer 12) and the ceramic substrate 11 are more reliably bonded.

In addition, in the embodiment, the Ag particles 35 dispersed in the nitride compound layer 31 have a relatively fine particle diameter in a range of 10 nm or more and 100 nm or less and it is assumed that the Ag particles are formed in the process of forming the aforementioned nitride compound layer 31 by the reaction between the nitride forming element (Ti in the embodiment) and nitrogen (N). Thus, the nitride compound layer 31 is sufficiently formed at the interface of the ceramic substrate 11, and thus it is possible to obtain the insulation circuit substrate 10 in which the copper plate 22 (circuit layer 12) and the ceramic substrate 11 are reliably bonded.

In addition, since the concentration of Ag in the near interface region with the ceramic substrate 11 in the nitride compound layer 31 is set to 0.3 atomic % or more in the embodiment, the nitride compound layer 31 is sufficiently formed at the bonding interface of the ceramic substrate 11 and the copper plate 22 (circuit layer 12) and the ceramic substrate 11 are bonded strongly together.

Further, since the ratio C2/C1 between the average Ag concentration C1 in the region A1 from the interface close to the ceramic substrate 11 (the interface with the ceramic substrate 11) to the 25% thickness position of the total thickness t of the nitride compound layer 31 and the average Ag concentration C2 in the region A2 from the interface close to the copper plate 22 (circuit layer 12) to the 25% thickness position of the total thickness t of the nitride compound layer 31 is set to 0.8 or less, and the concentration of Ag on the ceramic substrate 11 side is higher than the concentration of Ag on the copper plate 22 (circuit layer 12) side in the embodiment, the interface reaction sufficiently proceeds and thus it is possible to obtain the insulation circuit substrate 10 in which the copper plate 22 (circuit layer 12) and the ceramic substrate 11 are reliably bonded.

Further, since the heating rate, the holding temperature, the holding time, the cooling rate and the like are defined such that a temperature integration value calculated by adding up the values obtained by multiplying the temperature at a Cu—Si eutectic temperature (804° C.) or higher by time is set to be in a range of 180° C.·min or higher and 3500° C.·min or lower in the copper plate bonding step S02 in the embodiment, in the Cu—Si eutectic liquid phase 39, the reaction between Ti in the Ag—Cu—Ti-based brazing filler material 24 and the ceramic substrate 11 formed of silicon nitride ($Si_3N_4$), the reaction between the Ti in the Ag—Cu—Ti-based brazing filler material 24 and nitrogen (N) in the ceramic substrate 11, and the reaction between Si in the ceramic substrate 11 and Ti in the Ag—Cu—Ti-based brazing filler material 24 can be promoted and the insulation circuit substrate 10 in which the intermetallic compound phase 33 formed of the intermetallic compound including Ti and Si is present in the Ag—Cu eutectic layer 32 and Cu and Si 34 are present at the grain boundary of the nitride compound layer 31 can be manufactured. In addition, the Ag particles 35 are dispersed in the nitride compound layer 31.

In the copper plate bonding step S02, the holding temperature, the holding time, the cooling rate and the like may be defined such that a temperature integration value calculated by adding up the values obtained by multiplying the temperature at a Cu—Si eutectic temperature (804° C.) or higher by time is set to be in a range of 180° C.·min or higher and 3500° C.·min or lower, and even in a case where the temperature condition in the copper plate bonding step S02 is a relatively low temperature, the ceramic substrate 11 and the copper plate 22 can be relatively bonded. Thus, it is possible to prevent the ceramic substrate 11 from being deteriorated.

Further, since the bonding temperature is set to 850° C. or lower in the embodiment, excessive procession of the Cu—Ti intermetallic compound forming reaction can be suppressed and the generation of cracks in the ceramic substrate 11 can be suppressed.

Second Embodiment

Next, a second of the present invention will be described with reference to FIGS. 7 to 9.

A copper-ceramic bonded body according to the embodiment is an insulation circuit substrate 110 formed by bonding the ceramic substrate 11 which is a ceramic member, a copper plate 122 (circuit layer 112) which is a copper member, and a copper plate 123 (metal layer 113).

Figure 7:
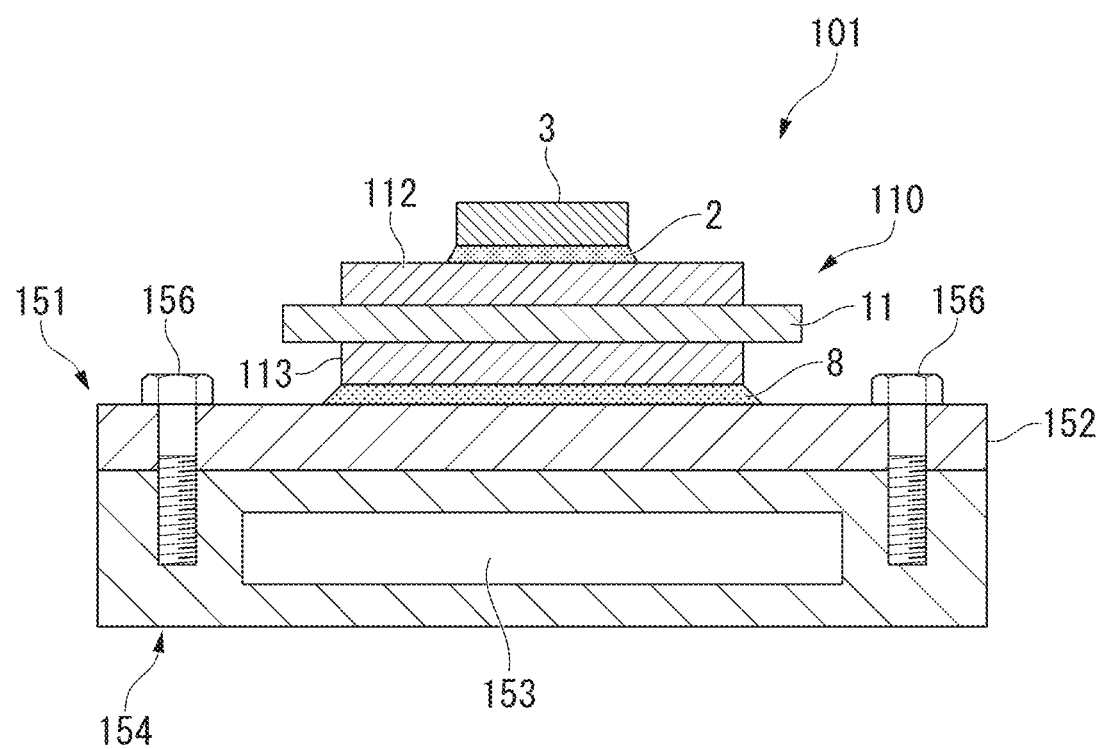
FIG. 7 is a schematic explanatory diagram of a power module using an insulation circuit substrate according to a second embodiment of the present invention.

FIG. 7 shows the insulation circuit substrate 110 according to the second embodiment of the present invention and a power module 101 using the insulation circuit substrate 110.

The power module 101 includes the insulation circuit substrate 110, the semiconductor element 3 bonded to one surface of the insulation circuit substrate 110 (upper side in FIG. 7) with a first solder layer 2 interposed therebetween, and a heat sink 151 arranged on the other surface of the insulation circuit substrate 110 (lower side in FIG. 7).

The insulation circuit substrate 110 includes the ceramic substrate 11, the circuit layer 112 arranged on one surface (upper surface in FIG. 7) of the ceramic substrate 11, and a metal layer 113 arranged on the other surface (lower surface in FIG. 7) of the ceramic substrate 11.

The ceramic substrate 11 prevents electric connection between the circuit layer 112 and the metal layer 113 and is formed of silicon nitride ($Si_3N_4$) having high insulating properties. Herein, a thickness of the ceramic substrate 11 is preferably set in a range of 0.2 mm to 1.5 mm and is set to 0.32 mm in the embodiment.

Figure 9:
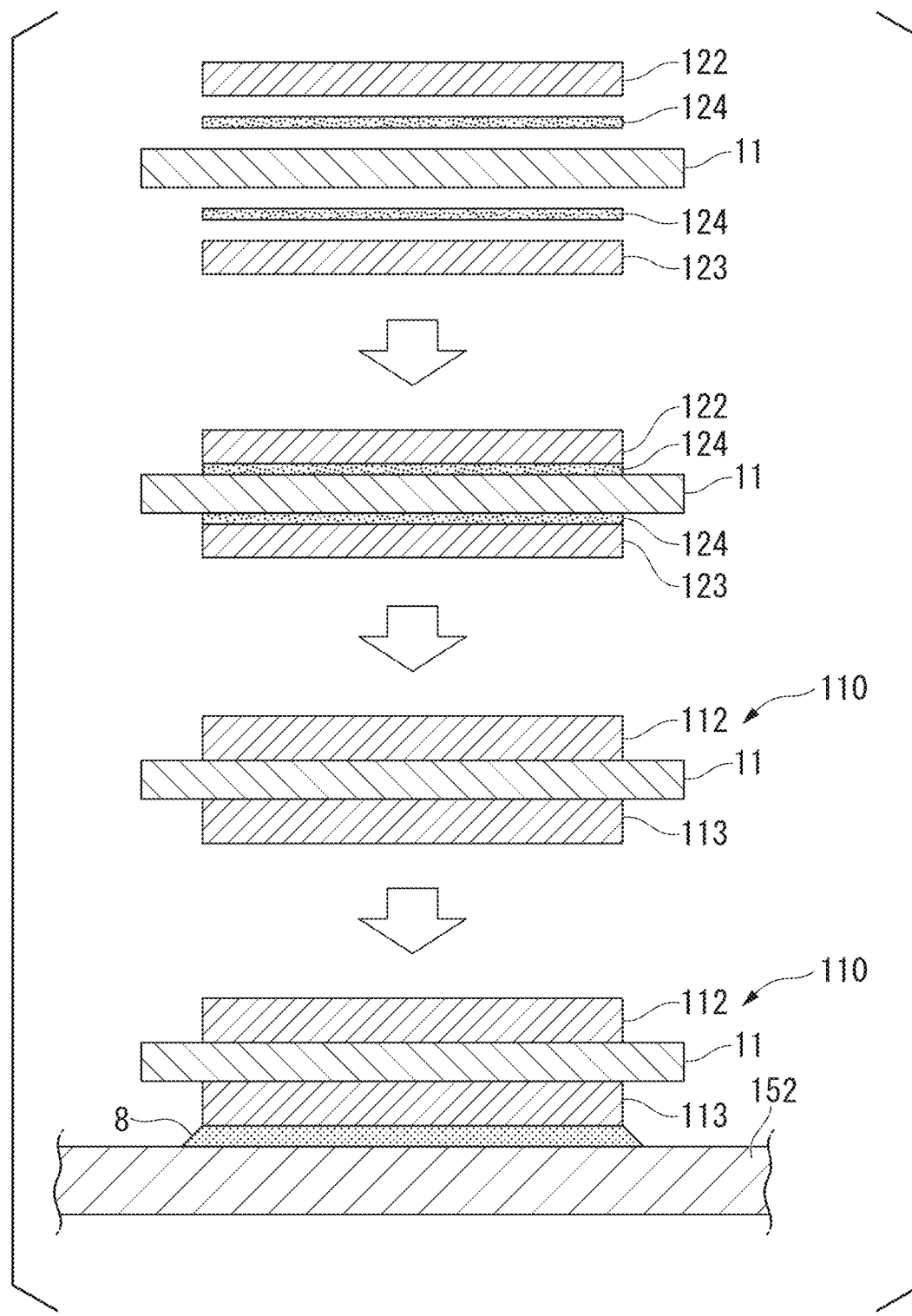
FIG. 9 is an explanatory diagram showing the method of manufacturing the insulation circuit substrate according to the second embodiment of the present invention.

As shown in FIG. 9, the circuit layer 112 is formed by bonding the copper plate 122 formed of copper or a copper alloy to one surface of the ceramic substrate 11. As the copper or the copper alloy, oxygen-free copper, tough pitch copper, and the like can be used. In the embodiment, a rolled sheet of tough pitch copper is used as the copper plate 122 constituting the circuit layer 112. A circuit pattern is formed in this circuit layer 112 and the one surface (upper surface in FIG. 7) is set as a mounted surface where the semiconductor element 3 is mounted. Herein, a thickness of the circuit layer 112 is preferably set in a range of 0.1 mm or more and 1.0 mm or less and is set to 0.6 mm in the embodiment.

As shown in FIG. 9, the metal layer 113 is formed by bonding a copper plate 123 to the other surface of the ceramic substrate 11. As the copper or the copper alloy, oxygen-free copper, tough pitch copper, and the like can be used. In the embodiment, a rolled sheet of tough pitch copper is used as the copper plate 123 constituting the metal layer 113. Here, a thickness of the metal layer 113 is preferably set in a range of 0.1 mm or more and 1.0 mm or less and is set to 0.6 mm in the embodiment.

The heat sink 151 is for cooling the aforementioned insulation circuit substrate 110 and is configured to have a heat radiation plate 152 which is bonded to the aforementioned insulation circuit substrate 110 and a cooler 154 which is arranged to be laminated on the heat radiation plate 152.

The heat radiation plate 152 causes heat from the aforementioned insulation circuit substrate 110 to spread in a plane direction, and is formed of copper or a copper alloy having excellent thermal conductivity. The heat radiation plate 152 and the metal layer 113 of the insulation circuit substrate 110 are bonded with a second solder layer 8 interposed therebetween.

As shown in FIG. 7, the cooler 154 includes a flow path 153 through which a cooling medium (for example, cooling water) is circulated. The cooler 154 is preferably formed of a material having good thermal conductivity and is made of A6063 (an aluminum alloy) in the embodiment.

As shown in FIG. 7, the heat radiation plate 152 is fastened to the cooler 154 by a fixing screw 156 via a grease layer (not shown).

Here, as shown in FIG. 9, the ceramic substrate 11 and the circuit layer 112 (copper plate 122), and the ceramic substrate 11 and the metal layer 113 (copper plate 123) are bonded using a brazing filler material including Ag, Cu, and one or two or more nitride forming elements selected from Ti, Nb, Hf, and Zr (Ag—Cu—Ti-based brazing filler material 124 including Ti as the nitride forming element in the embodiment).

At the bonding interface of the ceramic substrate 11 and the circuit layer 112 (copper plate 122) and the bonding interface of the ceramic substrate 11 and the metal layer 113 (copper plate 123), Cu and Si are present at the grain boundaries as in the first embodiment, and a nitride compound layer in which Ag particles are dispersed and an Ag—Cu eutectic layer are formed. An intermetallic compound phase formed of an intermetallic compound including a nitride forming element (Ti in the embodiment) and Si is formed between the ceramic substrate 11 and the circuit layer 112 (copper plate 122), and between the ceramic substrate 11 and the metal layer 113 (copper plate 123) (refer to FIGS. 2 and 3). The thickness of the nitride compound layer is set to 0.15 µm or more and 1.0 µm or less. Since the thickness of the nitride compound layer is set to 0.15 µm or more, the insulation circuit substrate 110 with high bonding strength can be obtained without generating unreacted portions at the bonding interface of the copper plate 122 (circuit layer 112) and the ceramic substrate 11 formed of silicon nitride ($Si_3N_4$). Further, since the thickness of the nitride compound layer is set to 1.0 µm or less, the generation of cracks in the nitride compound layer can be suppressed and the insulation circuit substrate 110 with high bonding strength can be obtained. In addition, since the thickness of the nitride compound layer is preferably 0.4 µm or more and 0.8 µm or less.

In addition, the intermetallic compound phase may be present in the Ag—Cu eutectic layer or may be present to be adjacent to the nitride compound layer. Further, the intermetallic compound phase may be present within 20 µm from the bonding interface of the circuit layer 112 (copper plate 122) and the ceramic substrate 11 to the circuit layer 112 (copper plate 122). In addition, the intermetallic compound phase may be present within 20 µm from the bonding interface of the ceramic substrate 11 and the metal layer 113 (copper plate 123) to the metal layer 113 (copper plate 123).

Next, a method of manufacturing the insulation circuit substrate 110 of the embodiment will be described with reference to FIGS. 8 and 9.

(Copper Plate Lamination Step S101)

Figure 8:
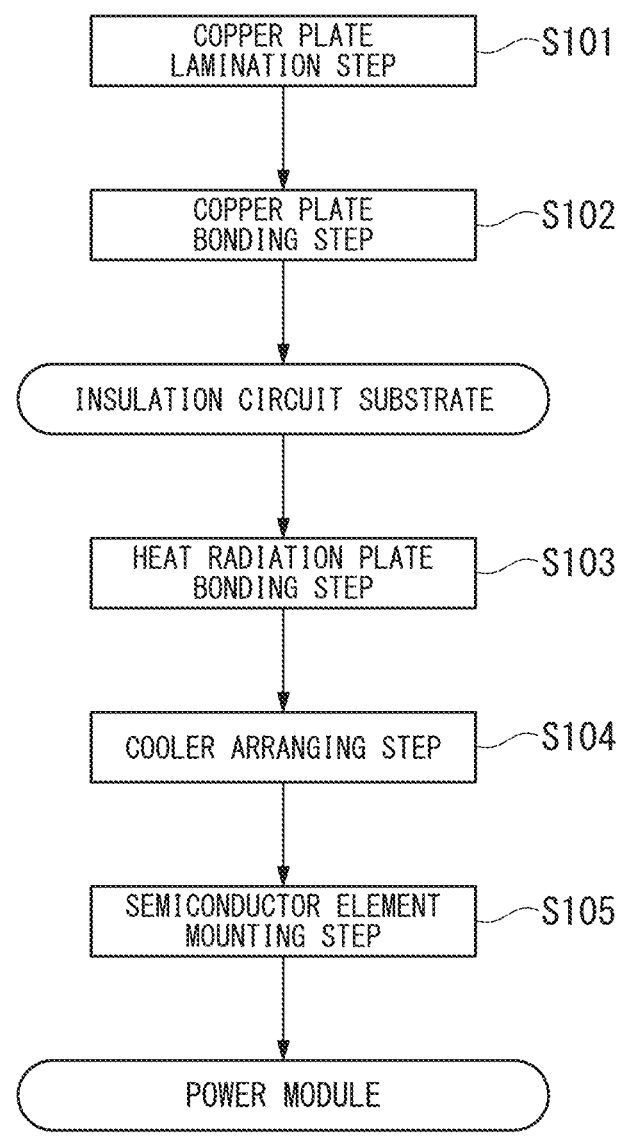
FIG. 8 is a flowchart showing a method of manufacturing the insulation circuit substrate according to the second embodiment of the present invention.

First, as shown in FIGS. 8 and 9, the copper plate 122 which becomes the circuit layer 112 is laminated on one surface of the ceramic substrate 11 with the Ag—Cu—Ti-based brazing filler material 124 interposed therebetween. In addition, the copper plate 123 which becomes the metal layer 113 is laminated on the other surface of the ceramic substrate 11 with the Ag—Cu—Ti-based brazing filler material 124 interposed therebetween.

Here, the Cu content in the Ag—Cu—Ti-based brazing filler material 124 is preferably 18 mass % or more and 34 mass % or less, the Ti content is preferably 0.3 mass % or more and 7 mass % or less. However, the embodiment is not limited thereto. In the embodiment, as the Ag—Cu—Ti-based brazing filler material 124, a foil is used and the thickness may be set in a range of 3 µm or more and 50 µm or less.

(Copper Plate Bonding Step S102)

Next, the copper plate 122, the ceramic substrate 11, and the copper plate 123 are put in a heating furnace in vacuum or an argon atmosphere and is heated in a state in which the copper plates and the ceramic substrate are compressed in a lamination direction under pressure in a range of 0.5 kgf/cm$^2$ or more and 35 kgf/cm$^2$ or less ($4.9 \times 10^4$ Pa or higher and $343 \times 10^4$ Pa or lower) to bond the copper plate 122, the ceramic substrate 11, and the copper plate 123.

In the copper plate bonding step S102, the heating rate, the holding temperature, the holding time, the cooling rate and the like are defined such that a temperature integration value calculated by adding up the values obtained by multiplying the temperature at a Cu—Si eutectic temperature (804° C.) or higher by time is set to be in a range of 180° C.·min or higher and 3500° C.·min or lower. Here, in a case where the bonding temperature is higher than 850° C., a Cu—Ti intermetallic compound forming reaction excessively proceeds and cracks may be generated in the ceramic substrate 11. Therefore, the upper limit of the bonding temperature is preferably set to 850° C.

The lower limit of the aforementioned temperature integration value is preferably set to 250° C.·min and more preferably set to 500° C.·min. in addition, the upper limit of the aforementioned temperature integration value is preferably set to 1900° C.·min and more preferably set to 1700° C.·min.

In the copper plate bonding step S102, since the temperature integration value calculated by adding up the values obtained by multiplying the temperature at a Cu—Si eutectic temperature (804° C.) or higher by time is set to be in the above range, Si is formed at the interface with the ceramic substrate 11 in the Ag—Cu eutectic liquid phase by a reaction between Ti in the Ag—Cu—Ti-based brazing filler material 124 and the ceramic substrate 11 formed of silicon nitride (Si$_3$N$_4$), and a Cu—Si eutectic liquid phase is formed by an eutectic reaction between this Si and Cu in the Ag—Cu—Ti-based brazing filler material 124. In the Cu—Si eutectic liquid phase, Ti in the Ag—Cu—Ti-based brazing filler material 124 and nitrogen (N) in the ceramic substrate 11 react with each other to produce titanium nitride. Thus, the nitride compound layer is formed in a form that the surface of the ceramic substrate 11 is eroded.

Further, Si in the ceramic substrate 11 and Ti in the Ag—Cu—Ti-based brazing filler material 124 react with each other to form an intermetallic compound phase.

In addition, Cu and Si are present at the grain boundary of the nitride compound layer growing as columnar crystals by the above reaction.

Further, the Ag particles are dispersed in the nitride compound layer.

Through the above steps, the insulation circuit substrate 110 of the embodiment is manufactured.

(Heat Radiation Plate Bonding Step S103)

Next, the heat radiation plate 152 is bonded to the other surface side of the metal layer 113 of the insulation circuit substrate 110.

The insulation circuit substrate 110 and the heat radiation plate 152 are laminated with a soldering material interposed therebetween and are put in a heating furnace to bond the insulation circuit substrate 110 and the heat radiation plate 152.

(Cooler Arranging Step S104)

Next, the cooler 154 is arranged on the other surface side of the heat radiation plate 152.

The heat radiation plate 152 and the cooler 154 are coupled by the fixing screw 156 by applying grease (not shown) between the heat radiation plate 152 and the cooler 154.

(Semiconductor Element Mounting step S105)

Next, the semiconductor element 3 is bonded to one surface of the circuit layer 112 of the insulation circuit substrate 110 by soldering.

Through the above steps, the power module 101 shown in FIG. 7 is manufactured.

According to the insulation circuit substrate 110 (copper-ceramic bonded boy) having the above-described configuration, since the copper plate 122 (circuit layer 112) and the copper plate 123 (metal layer 113) formed of tough pitch copper, and the ceramic substrate 11 formed of silicon nitride (Si$_3$N$_4$) are respectively bonded using the Ag—Cu—Ti-based brazing filler material 124, and in the copper plate bonding step S102, the temperature integration value calculated by adding up the values obtained by multiplying the temperature at a Cu—Si eutectic temperature (804° C.) or higher by time is set to be in the above range, it is possible to obtain the insulation circuit substrate 110 which has the same bonding interface as in the first embodiment and in which the copper plate 122 (circuit layer 112) and the ceramic substrate 11, and the copper plate 123 (metal layer 113) and the ceramic substrate 11 are reliably bonded.

Third Embodiment

Next, a third embodiment will be described with reference to FIGS. 10 to 12.

Figure 10:
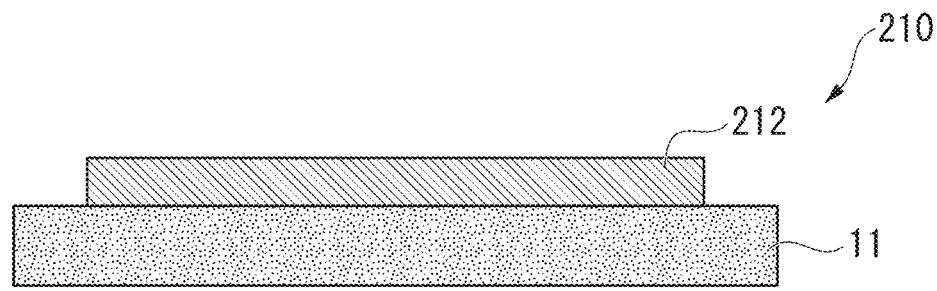
FIG. 10 is a schematic explanatory diagram of an insulation circuit substrate according to a third embodiment of the present invention.
Figure 11:
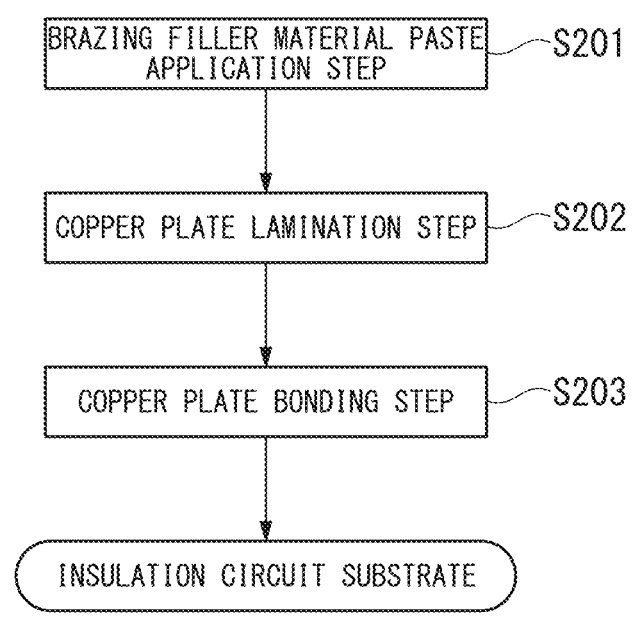
FIG. 11 is a flowchart showing a method of manufacturing the insulation circuit substrate according to the third embodiment of the present invention.

As shown in FIG. 10, a copper-ceramic bonded body according to the embodiment is an insulation circuit substrate 210 formed by bonding the ceramic substrate 11 which is a ceramic member, and a copper plate 222 (circuit layer 212) which is a copper member.

The ceramic substrate 11 is formed of silicon nitride (Si$_3$N$_4$) having high insulating properties and has the same configuration as those of the first and second embodiments.

Figure 12:
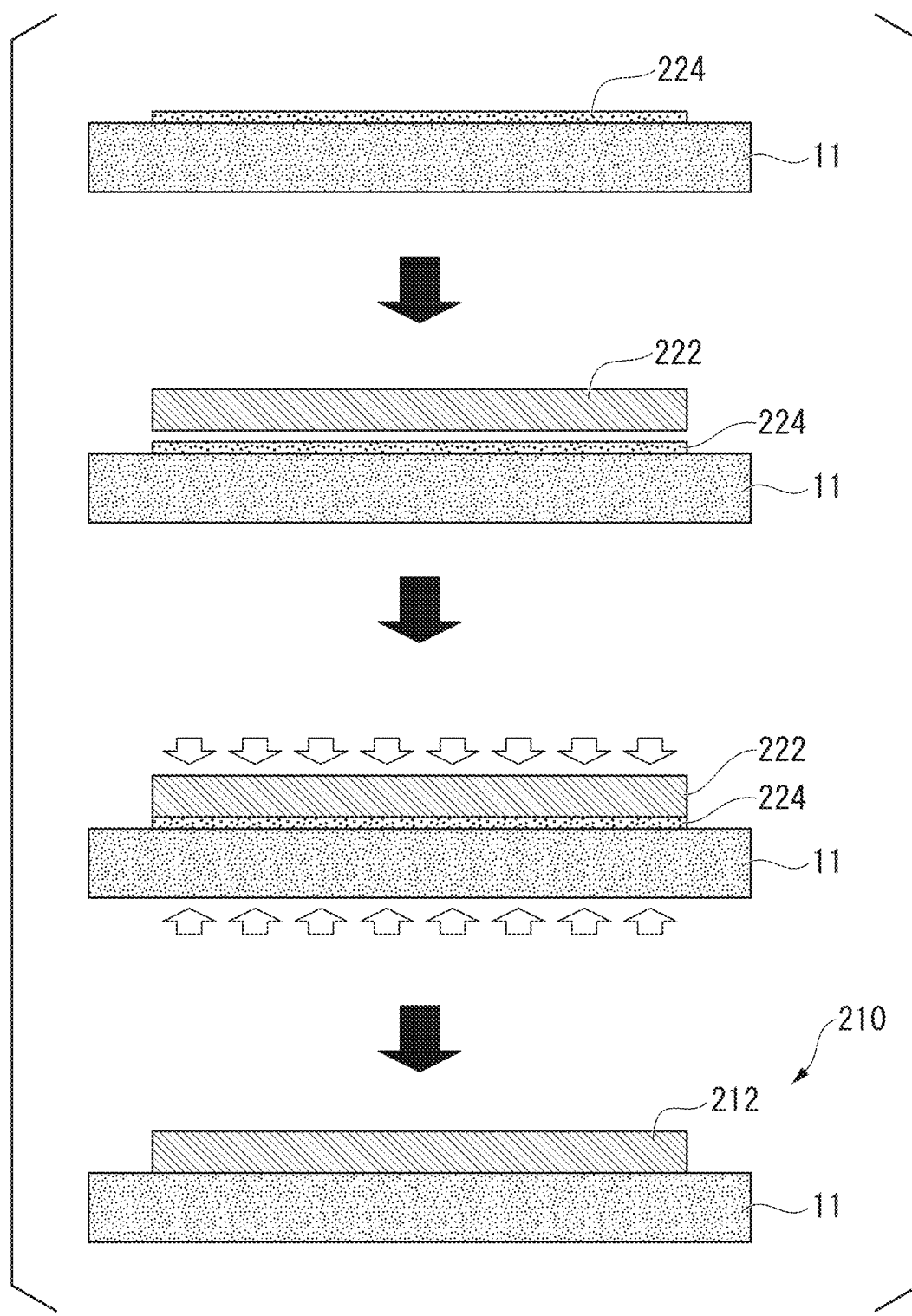
FIG. 12 is an explanatory diagram showing the method of manufacturing the insulation circuit substrate according to the third embodiment of the present invention.

As shown in FIG. 12, the circuit layer 212 is formed by bonding a copper plate 222 made of copper or a copper alloy, such as oxygen-free copper or tough pitch copper, to one surface of the ceramic substrate 11. In the embodiment, the copper plate 222 is a rolled sheet of oxygen-free copper.

Here, as shown in FIG. 12, the ceramic substrate 11 and the circuit layer 212 (copper plate 222) are bonded using a brazing filler material including Ag and one or two or more nitride forming elements selected from Ti, Nb, Hf, and Zr (Ag—Ti-based brazing filler material including Ti as the nitride forming element in the embodiment).

At the bonding interface of the ceramic substrate 11 and the circuit layer 212 (copper plate 222), as in the first embodiment, Cu and Si are present at the grain boundary and a nitride compound layer (titanium nitride layer) in which Ag particles are dispersed and an Ag—Cu eutectic layer are formed. An intermetallic compound phase formed of an intermetallic compound including a nitride forming element (Ti in the embodiment) and Si is present between the ceramic substrate 11 and the circuit layer 212 (copper plate 222) (refer to FIGS. 2 and 3). The thickness of the nitride compound layer is set to 0.15 µm or more and 1.0 µm or less. Since the thickness of the nitride compound layer is set to 0.15 µm or more, the insulation circuit substrate 210 with high bonding strength can be obtained without generating unreacted portions at the bonding interface of the copper plate 222 (circuit layer 212) and the ceramic substrate 11 formed of silicon nitride (Si$_3$N$_4$). Further, since the thickness of the nitride compound layer is set to 1.0 µmm or less, the generation of cracks in the nitride compound layer can be suppressed, and the insulation circuit substrate 210 with high bonding strength can be obtained. In addition, the thickness of the nitride compound layer is preferably 0.4 µm or more and 0.8 µm or less.

In addition, the intermetallic compound phase may be present in the Ag—Cu eutectic layer or may be present to be adjacent to the nitride compound layer. Further, the intermetallic compound phase may be present within 20 µm from the bonding interface of the copper plate 222 (circuit layer 212) and the ceramic substrate 11 to the copper plate 222 (circuit layer 212).

Next, a method of manufacturing the insulation circuit substrate 210 of the embodiment will be described with reference to FIGS. 11 and 12.

(Brazing Filler Material Paste Application Step S201)

First, an Ag—Ti-based brazing filler material paste 224 is applied to one surface of the ceramic substrate 11 by screen printing. The thickness of the Ag—Ti-based brazing filler material paste 224 is set to 20 µm to 300 µm after drying.

Here, the Ag—Ti-based brazing filler material paste 224 includes a powder component containing Ag and Ti, a resin, a solvent, a dispersing agent, a plasticizer, and a reducing agent.

In the embodiment, the content of the powder component is set to 40 mass % or more and 90 mass % or less with respect to the total amount of the Ag—Ti-based brazing filler material paste 224. In addition, in the embodiment, the viscosity of the Ag—Ti-based brazing filler material paste 224 is adjusted to 10 Pa·s or more and 500 Pa·s or less and more preferably to 50 Pa·s or more and 300 Pa·s or less.

As the composition of the powder component, the Ti content is 0.4 mass % or more and 75 mass % or less and the balance includes Ag and inevitable impurities. In the embodiment, the powder component includes 10 mass % of Ti and the balance consisting of Ag and inevitable impurities.

Further, in the embodiment, as the powder component including Ag and Ti, an alloy powder of Ag and Ti is used. The alloy powder is prepared by an atomizing method and the prepared alloy powder is sieved. Thus, the particle diameter is set to 40 µm or less, preferably set to 20 µm or less, and still more preferably set to 10 µm or less.

(Copper Plate Lamination Step S202)

Next, the copper plate 222 which becomes the circuit layer 212 is laminated on one surface of the ceramic substrate 11.

(Copper Plate Bonding Step S203)

Next, in a state in which the copper plate 222 and the ceramic substrate 11 are compressed in the lamination direction under pressure in a range of 0.5 kgf/cm$^2$ or higher and 35 kgf/cm$^2$ or lower ($4.9 \times 10^4$ Pa or higher and $343 \times 10^4$ Pa or lower), the copper plate and the ceramic substrate are put into a heating furnace in a vacuum or argon atmosphere and heated to bond the copper plate 222 and the ceramic substrate 11.

In the copper plate bonding step S203, the heating rate, the holding temperature, the holding time, the cooling rate and the like are defined such that a temperature integration value calculated by adding up the values obtained by multiplying the temperature at a Cu—Si eutectic temperature (804° C.) or higher by time is set to be in a range of 180° C.·min or higher and 3500° C.·min or lower. Here, in a case where the bonding temperature is higher than 850° C., a Cu—Ti intermetallic compound forming reaction excessively proceeds and cracks may be generated in the ceramic substrate 11. Therefore, the upper limit of the bonding temperature is preferably set to 850° C.

The lower limit of the aforementioned temperature integration value is preferably set to 250° C.·min and more preferably set to 500° C.·min. In addition, the upper limit of the aforementioned temperature integration value is preferably set to 1900° C.·min and more preferably set to 1700° C.·min.

In the copper plate bonding step S203, since the temperature integration value calculated by adding up the values obtained by multiplying the temperature at a Cu—Si eutectic temperature (804° C.) or higher by time is set to be in the above range, Si is formed at the interface with the ceramic substrate 11 in the Ag—Cu eutectic liquid phase by a reaction between Ti in the Ag—Ti-based brazing filler material paste 224 and the ceramic substrate 11 formed of silicon nitride ($Si_3N_4$), and a liquid phase is formed by an eutectic reaction between this Si and Cu in the copper plate 222. In the liquid phase, Ti in the Ag—Ti-based brazing filler material paste 224 and nitrogen (N) in the ceramic substrate 11 react with each other to produce titanium nitride. Thus, the nitride compound layer is formed in a form that the surface of the ceramic substrate 11 is eroded.

Further, Si in the ceramic substrate 11 and Ti in the Ag—Ti-based brazing filler material paste 224 react with each other to form an intermetallic compound phase.

In addition, Cu and Si are present at the grain boundary of the nitride compound layer growing as columnar crystals by the above reaction.

Further, the Ag particles are dispersed in the nitride compound layer.

Through the above steps, the insulation circuit substrate 210 of the embodiment is manufactured.

According to the insulation circuit substrate 210 (copper-ceramic bonded body) having the above-described configuration, since the copper plate 222 (circuit layer 212) formed of oxygen-free copper and the ceramic substrate 11 formed of silicon nitride ($Si_3N_4$) are bonded using the Ag—Ti-based brazing filler material paste 224, and in the copper plate bonding step S203, the temperature integration value calculated by adding up the values obtained by multiplying the temperature at a Cu—Si eutectic temperature (804° C.) or higher by time is set to be in the above range, it is possible to obtain the insulation circuit substrate 210 which has the same bonding interface as in the first embodiment and in which the copper plate 222 (circuit layer 212) and the ceramic substrate 11 are reliably bonded.

Hereinabove, the embodiments of the present invention have been described, but the present invention is not limited thereto and can be suitably modified within a range not departing technical ideas of the present invention.

For example, the copper plate constituting the circuit layer or the metal layer is described as the rolled sheet of oxygen-free copper, but the embodiment is not limited thereto. The copper plate may be formed of other copper or copper alloys.

In the first embodiment, the aluminum plate constituting the metal layer is described as the rolled sheet of pure aluminum having a purity of 99.99 mass %, but the embodiment is not limited thereto. The aluminum plate may be formed of other aluminum such as aluminum (2N aluminum) having a purity of 99 mass % or aluminum alloys.

Further, in the embodiment, the Ag particles are dispersed in the nitride compound layer but the embodiment is not limited thereto.

In addition, in the embodiment, the particle diameter of the Ag particles dispersed in the nitride compound layer is set to be in a range of 10 nm or more and 100 nm or less but Ag particles having another particle diameter may be used.

Further, the heat sink and the heat radiation plate are not limited to the examples of the embodiment and the structure of the heat sink is not particularly limited.

In addition, a buffer layer formed of aluminum, an aluminum alloy, or a composite material including aluminum (for example, AlSiC) may be provided between the top plate portion of the heat sink or the heat radiation plate and the metal layer.

Further, in the embodiment, Ti is used as the nitride forming element, and the nitride compound layer formed of titanium nitride, and the intermetallic compound phase including Ti and Si are provided, but the embodiment is not limited thereto. One or two or more nitride forming elements selected from Ti, Nb, Hf, and Zr may be used, and a nitride compound layer including the nitride forming element, and an intermetallic compound phase including the nitride forming element and Si may be provided.

Further, in the third embodiment, the ceramic substrate and the copper plate are bonded using the Ag—Ti-based brazing filler material paste, but the embodiment is not limited thereto. An Ag—Cu—Ti-based paste may be used. In this case, the copper-ceramic bonded body has the same interface structure as that of the first embodiment.

In addition, the Ag—Ti-based brazing filler material paste is applied to the ceramic substrate, but the embodiment is not limited thereto. The Ag—Ti-based brazing filler material paste or the like may be applied to the copper plate.

Further, the Ag—Ti-based brazing filler material paste is applied by screen printing but the application method is not limited.

In addition, before the lamination step (S202), a step of drying the Ag—Ti-based brazing filler material paste may be provided.

Further, in the third embodiment, as the powder component including Ag and Ti, the alloy powder of Ag and Ti is used. However, the embodiment is not limited thereto and a mixed powder of an Ag powder and a Ti powder can be used. In this case, the particle diameter of the Ag powder to be used is 40 µm or less, preferably 20 µm or less, and more preferably 10 µm or less.

In addition, instead of using the Ti powder, a $TiH_2$ powder can be used. In the case of using the $TiH_2$ powder, as the composition of the powder component, the $TiH_2$ content is 0.4 mass % or more and 50 mass % or less and the balance may include Ag and inevitable impurities. The particle diameter of the $TiH_2$ powder to be used may be preferably 15 µm or less and more preferably 5 µm or less. Further, in the case of a paste using the $TiH_2$ powder, the thickness of the applied paste may be 20 µm or more and 300 µm or less after drying.

In addition, a paste made of a mixed powder of an Ag powder, a Cu powder, and a Ti powder, or a $TiH_2$ powder can be used.

In addition, one or two or more elements selected from In, Sn, Al, Mn and Zn can be added to the Ag—Cu—Ti-based brazing filler material and the Ag—Ti-based brazing filler material described in the embodiment. In this case, the bonding temperature can be further lowered.

Further, as the Ag—Ti-based brazing filler material paste, a paste including Ti, one or two or more elements selected from In, Sn, Al, Mn and Zn, and the balance including Ag and inevitable impurities can be used. In this case, the bonding temperature can be further lowered.

In addition, in the second embodiment, instead of using the foil of the Ag—Ti-based brazing filler material, the Ag—Cu—Ti-based brazing filler material paste described in the third embodiment can be used.

In addition, in the embodiment, the power semiconductor element is mounted on the insulation circuit substrate to constitute the power module, but there is no limitation thereto. For example, an LED element may be mounted on the circuit layer of the insulation circuit substrate to constitute an LED module or a thermoelectric element may be mounted on the circuit layer of the insulation circuit substrate to constitute a thermoelectric module.

EXAMPLES

Confirmation tests performed to check the effectiveness of the embodiments according to the present invention will be described.

Example 1

A copper-ceramic bonded body was formed using a ceramic substrate formed of silicon nitride ($Si_3N_4$), a brazing filler material, and a copper plate. Specifically, a copper plate formed of the material shown in Table 1 was bonded to one surface of a ceramic substrate having a size of 40 mm square and a thickness of 0.32 mm In Table 1, "TPC" means tough pitch copper and "OFC" means oxygen-free copper. The size of the copper plate was set to 44 mm×25 mm (however, the plate protruded 5 mm from the end portion of the ceramic substrate). The copper plate was bonded to the ceramic substrate with the brazing filler material interposed between the ceramic substrate and the copper plate under the conditions shown in Table 1 to form a copper-ceramic bonded body. In addition, the applied pressure (load) in the lamination direction was set to 1.5 kgf/cm² and the bonding atmosphere was set to vacuum ($3\times10^{-5}$ Pa).

In a case of an Ag—Cu—Ti foil as the brazing filler material, a brazing filler material having a composition of Ag-28 mass % Cu-3 mass % Ti (thickness: 20 µm) was used.

In a case of an Ag—Ti foil, a brazing filler material having a composition of Ag-10 mass % Ti (thickness: 20 µm) was used.

In a case of an Ag—Cu—Ti paste, a paste containing a brazing filler material powder including a powder component (particle diameter: 20 µm) having a composition of Ag-28 mass % Cu-3 mass % Ti, an acrylic resin, and texanol was applied to have a thickness of 150 µm after drying and was used as a brazing filler material.

In a case of an Ag—Ti paste, a paste containing a brazing filler material powder including a powder component (particle diameter: 20 µm) having a composition of Ag-10 mass % Ti, an acrylic resin, and texanol was applied to have a thickness of 150 µm after drying and was used as a brazing filler material.

In a case of an Ag—Zr paste, a paste containing a brazing filler material powder including a powder component (particle diameter: 20 µm) having a composition of Ag-17 mass % Zr, an acrylic resin, and texanol was applied to have a thickness of 150 µm after drying and was used as a brazing filler material.

In a case of an Ag—Hf past, a paste containing a brazing filler material powder including a powder component (particle diameter: 40 µm) having a composition of Ag-29 mass % Hf, an acrylic resin, and texanol was applied to have a thickness of 150 µm after drying and was used as a brazing filler material.

In a case of an Ag—Nb paste, a paste containing a brazing filler material powder including a powder component (particle diameter: 20 µm) having a composition of Ag-18 mass % Nb, an acrylic resin, and texanol was applied to have a thickness of 150 µm after drying and was used as a brazing filler material.

Regarding the copper-ceramic bonded body obtained as described above, the thickness of the nitride compound layer, the presence of the intermetallic compound phase in the Ag—Cu eutectic layer, the presence of Cu and Si at the grain boundary of the nitride compound layer, the presence (particle diameter) of Ag particles in the nitride compound layer, and 90° peeling strength between the copper plate and the ceramic substrate were evaluated.

(Observation of Bonding Interface)

5 visual fields of the bonding interfaces (a section vertical to the surface of the ceramic substrate) between the copper plate and the ceramic substrate were observed using scanning electron microscope (ULTRA 55 manufactured by Carl Zeiss NTS GmbH) at a magnitude of 15,000 times (measurement visual field: 6 µm×8 µm) and the thickness of the nitride compound layer, the presence of the intermetallic compound phase in the Ag—Cu eutectic layer, and the presence (particle diameter) of Ag particles in the nitride compound layer were confirmed.

Regarding the thickness of the nitride compound layer, the element mapping of a nitride forming element selected from Ti, Nb, Hf, and Zr and N at the bonding interface of the copper plate and the ceramic substrate was acquired and a region in which the nitride forming element and nitrogen (N) coexisted was considered as the nitride compound layer, the area of the region was measured, and the measured area was divided by the dimension of the measurement visual field to obtain a value. The average value of values obtained in 5 visual fields was used as the thickness of the nitride compound layer.

Regarding the presence of the intermetallic compound phase, a case where in the element mapping of the nitride forming element and Si, the region in which the nitride forming element and Si coexisted was present and the concentration of the nitride forming element of the region was 60 mass % or more and 90 mass % or less was regarded as "presence" of the intermetallic compound phase.

The bonding interface was observed with a transmission electron microscope (Titan ChemiSTEM manufactured by FEI Company) at an acceleration voltage of 200 kV and a magnification of 910000 times and the presence of Cu and Si at the grain boundary of the nitride compound layer was confirmed by element mapping with a beam diameter of about 0.1 nm.

Regarding the presence of the Ag particles, the element mapping of Ag in the nitride compound layer was converted to 8 bit grayscale to acquire an Ag distribution image. The Ag distribution image was binarized based on Kapur-Sahoo-Wong (Maximum Entropy) thresholding method (Kapur, J N; Sahoo, P K; Wong, A C K (1985), refer to "A New Method for Gray-Level Picture Thresholding Using the Entropy of the Histogram", Graphical Models and Image Processing 29(3): 273 to 285). The contour of the Ag particles was extracted from the binarized image and the circle equivalent diameter (diameter) was calculated from the area (number of pixels) in the contour. Then, D50 of the calculated circle equivalent diameters was used as the particle diameter of the Ag particles.

(90° Peeling Strength Test)

In copper-ceramic bonded body, after being left to stand at 150° C. for 500 hours, a portion of the bonded copper plate protruding from the ceramic substrate was bent at 90° and the copper plate was pulled in a direction vertical to the ceramic substrate. The maximum tensile load was measured until the copper plate was peeled off from the ceramic substrate. A value obtained by dividing the load by the bonding length (39 mm) was used as 90° peeling strength and was shown in Table 1.

Figure 13:
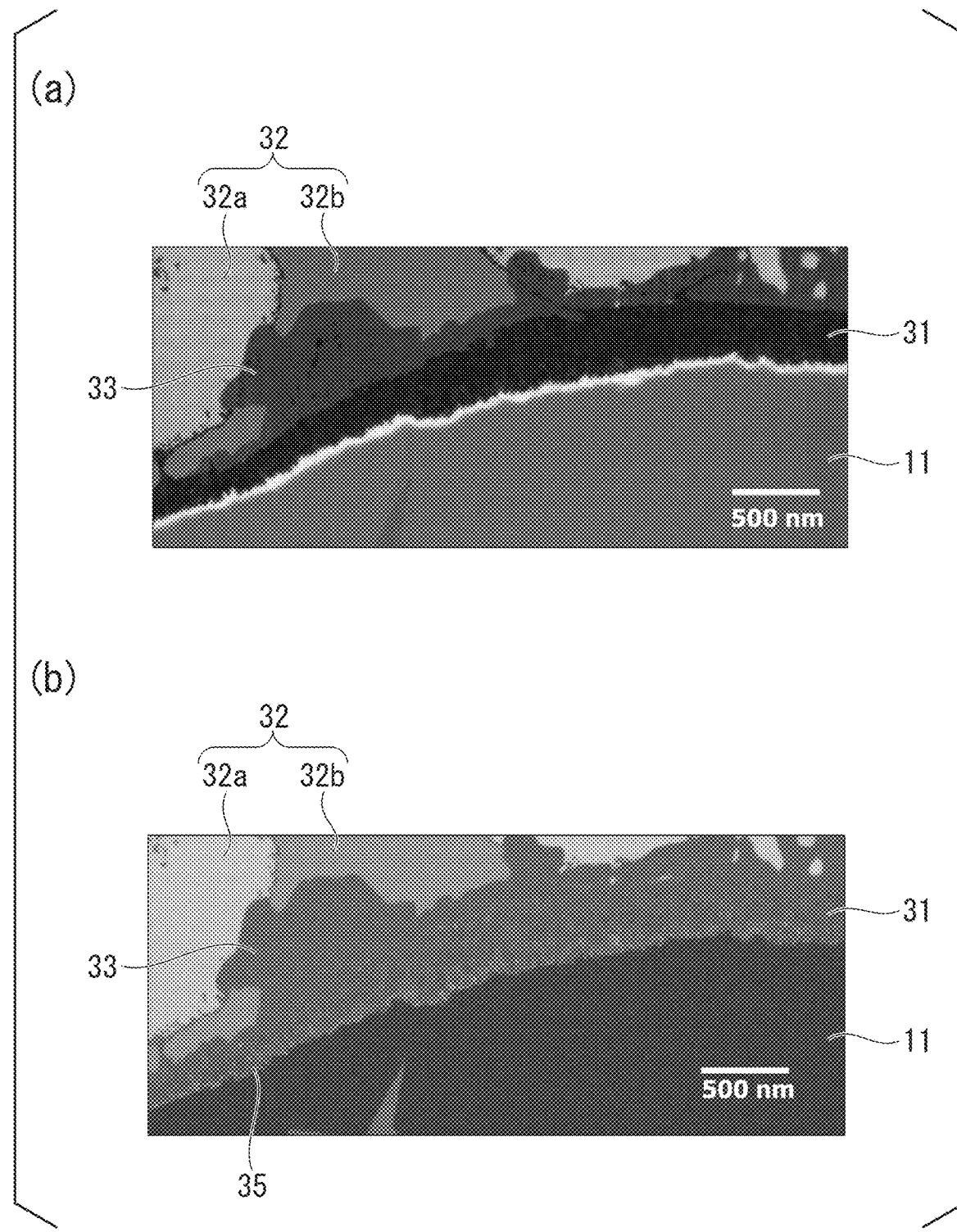
FIG. 13 is a scanning electron microscope (SEM) image of a section of a copper-ceramic bonded body of Example 1.
Figure 14:
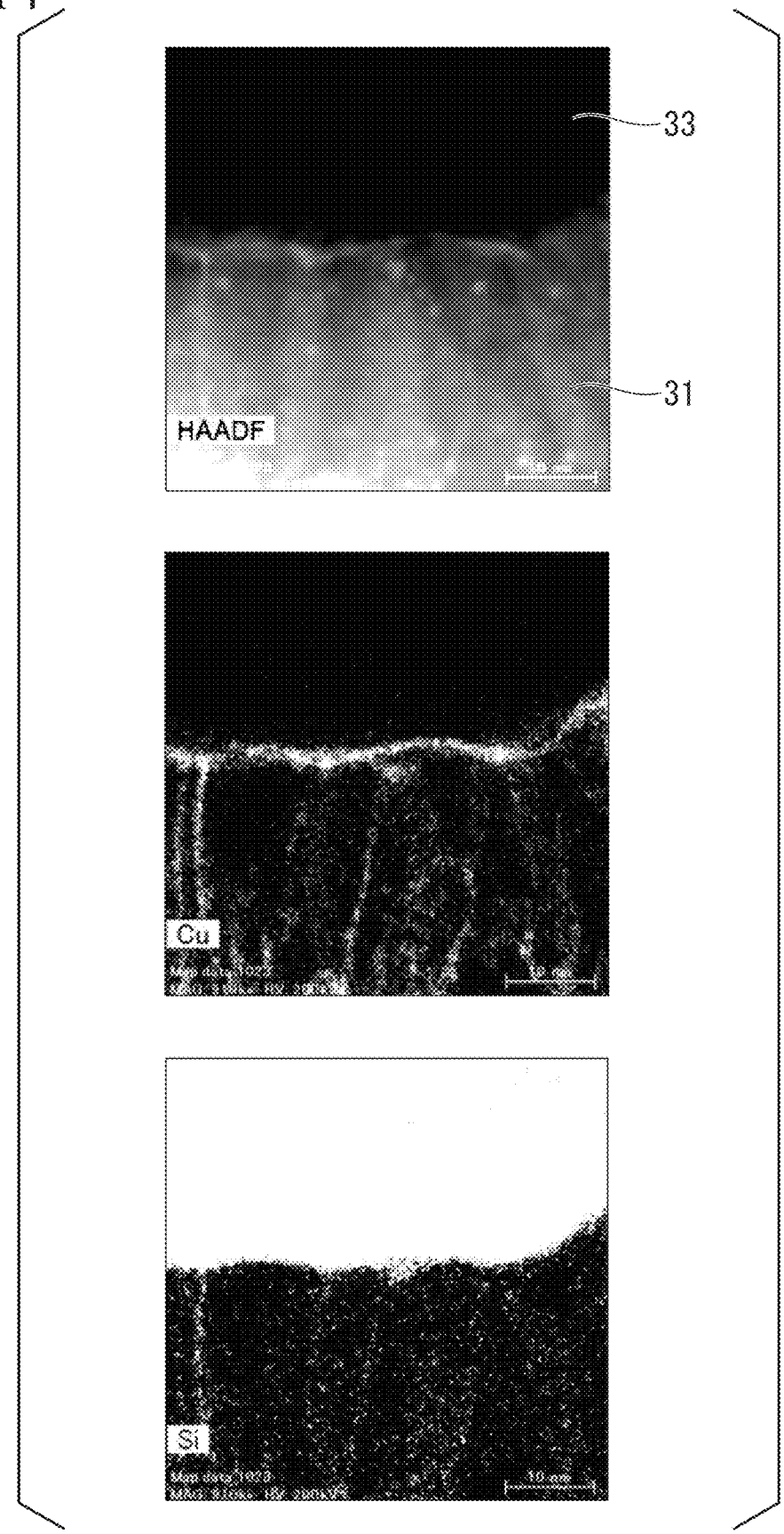
FIG. 14 is a scanning transmission electron microscope (STEM) image of a section of a copper-ceramic bonded body of Example 1.

The valuation results are shown in Table 1. In addition, the SEM observation result of the copper-ceramic bonded body of Example 1 is shown in FIG. 13 and the STEM observation result of the copper-ceramic bonded body of Example 1 is shown in FIG. 14.

In Comparative Example 1 in which Cu and Si were not present in the nitride compound layer and the thickness of the nitride compound layer was less than 0.15 μm, the 90° peeling strength was 3.2 kN/m and was low. This is because it is assumed that the generation of cracks in the nitride compound layer cannot be suppressed and unreacted portions are generated at the bonding interface of the ceramic substrate and the copper plate.

In Comparative Example 2 in which the thickness of the nitride compound layer was 1.24 μm, the 90° peeling strength was 4.5 kN/m and was low. This is because it is assumed that the nitride compound layer is formed to be thicker than necessary and cracks are generated.

In contrast, in all of Examples 1 to 10, the 90° peeling strength was high. This is because it is assumed that the thickness of the nitride compound layer is set to 0.15 μm or more and 1.0 μm or less, Cu and Si are present in the nitride compound layer, and the generation of cracks in the nitride compound layer is suppressed.

Here, in Examples, as shown in (a) of FIG. 13 (In Lens secondary electron (SE) image), the nitride compound layer 31 and the Ag—Cu eutectic layer 32 (in (a) of FIG. 13, Ag 32a and Cu 32b constituting the Ag—Cu eutectic layer 32 are observed) were observed at the bonding interface of the ceramic substrate ($Si_3N_4$) 11.

In addition, it was confirmed that the intermetallic compound phase 33 was present between the copper plate and the ceramic substrate and adjacent to the nitride compound layer 31 in the Ag—Cu eutectic layer 32.

In addition, it was confirmed that the Ag particles 35 were dispersed in the aforementioned nitride compound layer 31 as shown in (b) of FIG. 13 (backscattered electron (BSE) image).

In Examples, it was confirmed that as shown in FIG. 14 (the upper image is a high angle annular dark field (HAADF) image, the middle image is Cu element flapping, and the lower image is Si element mapping), Cu and Si were present at the grain boundary of the nitride compound layer.

Example 2

An insulation circuit substrate was formed using a ceramic substrate formed of silicon nitride ($Si_3N_4$), a brazing filler material, and a copper plate. Specifically, the copper plate formed of the material shown in Table 2 was bonded to both surfaces of the ceramic substrate having a size of 40

TABLE 1

| | | | | Temperature | Interface observation result | | | | |
|---|---|---|---|---|---|---|---|---|---|
| | | | | integration | Thickness of nitride | Intermetallic | | | 90° peeling |
| | Copper plate | Kind of brazing filler material | Form | value (° C. · min) | compound layer (μm) | compound phase | Cu and Si | Particle diameter of Ag particle (nm) | strength (kN/m) |
| Example | 1 TPC | Ag—Ti | Foil | 184 | 0.17 | Presence | Presence | 108 | 5.2 |
| | 2 OFC | Ag—Cu—Ti | Foil | 250 | 0.22 | Presence | Presence | 98 | 6.4 |
| | 3 OFC | Ag—Cu—Ti | Foil | 509 | 0.21 | Presence | Presence | 44 | 7.1 |
| | 4 OFC | Ag—Cu—Ti | Foil | 698 | 0.47 | Presence | Presence | 35 | 11.0 |
| | 5 OFC | Ag—Cu—Ti | Paste | 823 | 0.66 | Presence | Presence | 30 | 14.5 |
| | 6 OFC | Ag—Cu—Ti | Paste | 1108 | 0.59 | Presence | Presence | 27 | 16.4 |
| | 7 OFC | Ag—Cu—Ti | Paste | 1201 | 0.85 | Presence | Presence | 27 | 15.2 |
| | 8 OFC | Ag—Ti | Paste | 1740 | 0.56 | Presence | Presence | 20 | 14.6 |
| | 9 OFC | Ag—Ti | Foil | 1909 | 0.89 | Presence | Presence | 19 | 12.4 |
| | 10 OFC | Ag—Ti | Foil | 3501 | 0.97 | Presence | Presence | 10 | 7.5 |
| | 11 OFC | Ag—Zr | Paste | 1740 | 0.81 | Presence | Presence | 12 | 15.4 |
| | 12 OFC | Ag—Hf | Paste | 1740 | 0.61 | Presence | Presence | 23 | 12.3 |
| | 13 OFC | Ag—Nb | Paste | 1740 | 0.63 | Presence | Presence | 25 | 13.5 |
| Comparative Example | 1 OFC | Ag—Cu—Ti | Foil | 67 | 0.09 | Presence | Absence | 125 | 3.2 |
| | 2 OFC | Ag—Ti | Paste | 5198 | 1.24 | Presence | Presence | 10 | 4.5 | mm square and a thickness of 0.32 mm The size of the copper plate was set to 37 mm square and the thickness was set to 0.8 mm. The copper plates were bonded to the ceramic substrate with the brazing filler material interposed between the ceramic substrate and the copper plate under the conditions shown in Table 2 to form a copper-ceramic bonded body. In addition, the applied pressure (load) in the lamination direction was set to 1.5 kgf/cm$^2$ and the bonding atmosphere was set to vacuum ($3\times10^{-5}$ Pa). As the brazing filler material shown in Table 2, the same brazing filler material as in Example 1 above was used.

Regarding the insulation circuit substrate obtained as described above, the thickness of the nitride compound layer, the ratio C2/C1 between the average Ag concentration C1 in the region at a 25% thickness position of the total thickness from the interface close to the ceramic substrate in the nitride compound layer and the average Ag concentration C2 in the region at a 25% thickness position of the total thickness from the interface close to the copper plate, the initial bonding rate between the ceramic substrate and the copper plate, and cracks in the ceramic substrate by a hot-cold cycle test were evaluated.

(Thickness of Nitride Compound Layer and Concentration of Ag in Nitride Compound Layer)

The line analysis of the nitride compound layer in the thickness direction was performed using a transmission electron microscope (Titan ChemiSTEM manufactured by FEI Company) at an acceleration voltage of 200 kV and a magnification of 910000 times, and a graph in which the vertical axis represents the concentration of Ag and the horizontal axis represents the measurement position was created.

In addition, regarding the interface of the copper plate and the nitride compound layer, the position in which the concentration of the nitride forming element in the line analysis first reached 10 at % or more as viewed from the copper plate side was set as the interface.

The total thickness t of the nitride compound layer was calculated from the interface position with the ceramic substrate defined as described above and the interface position with the copper plate.

(Initial Bonding Rate)

The bonding rate between the copper plate and the ceramic substrate was obtained by the following expression using an ultrasonic flow detector (Fine SAT 200 manufactured by Hitachi Power Solutions Co., Ltd.). Here, the initial bonding area was set to an area to be bonded before bonding, that is, the area of the bonding area of the copper plate. In an ultrasonic flaw image, peeling was indicated by white portions in the bonding portion and thus the area of the white portions was set to a peeled area.

(Bonding rate)={((Initial bonding area)−(Peeled area)}/(Initial bonding area)

(Cracks of Ceramic Substrate)

Each time 200 cycles including a cycle of 5 minutes at −40° C. and a cycle of 5 minutes at 150° C. were repeated using a hot-cold shock testing device (TSA-72ES manufactured by ESPEC CORP.), the presence of cracks in the ceramic substrate was confirmed and the number of times when cracks were confirmation was measured. A ceramic substrate in which cracks were confirmed at the time of the 1400th loading was denoted as ">1400".

TABLE 2

| | | Copper plate | Kind of brazing filler material | Form | Temperature integration value (° C. · min) | Thickness of nitride compound layer (μm) | $C_1$ (at %) | $C_2$ (at %) | $C_2/C_1$ | Initial bonding rate (%) | Number of cycles when cracks were generated |
|---|---|---|---|---|---|---|---|---|---|---|---|
| Example | 21 | OFC | Ag—Ti | Paste | 327 | 0.24 | 0.41 | 0.32 | 0.77 | 91.4 | 800 |
| | 22 | OFC | Ag—Cu—Ti | Foil | 438 | 0.33 | 0.89 | 0.41 | 0.46 | 94.9 | 1000 |
| | 23 | OFC | Ag—Cu—Ti | Foil | 515 | 0.43 | 1.46 | 0.28 | 0.19 | 98.1 | 1200 |
| | 24 | OFC | Ag—Cu—Ti | Paste | 515 | 0.41 | 2.05 | 0.49 | 0.24 | 98.1 | 1200 |
| | 25 | OFC | Ag—Cu—Ti | Paste | 730 | 0.55 | 7.43 | 0.15 | 0.02 | 99.3 | >1400 |
| | 26 | OFC | Ag—Ti | Foil | 1860 | 0.84 | 14.85 | 0.00 | 0.00 | 99.6 | 1200 |
| | 27 | OFC | Ag—Ti | Paste | 920 | 0.60 | 10.64 | 0.11 | 0.01 | 99.0 | >1400 |
| | 28 | OFC | Ag—Zr | Paste | 920 | 0.64 | 10.06 | 0.00 | 0.00 | 98.2 | >1400 |
| | 29 | OFC | Ag—Hf | Paste | 920 | 0.52 | 9.92 | 0.20 | 0.02 | 99.6 | >1400 |
| | 30 | OFC | Ag—Nb | Paste | 920 | 0.55 | 9.76 | 0.10 | 0.01 | 98.6 | >1400 |

The area enclosed by the horizontal axis passing through the origin in a region from the interface close to the ceramic substrate to a 25% (t/4) thickness position of the total thickness t of the nitride compound layer while setting the total thickness of the nitride compound layer to t, and the Ag concentration curve was divided by t/4 to obtain the average Ag concentration C1. In addition, the area enclosed by the horizontal axis passing through the origin in a region from the interface close to the copper plate to a 25% (t/4) thickness position of the total thickness t of the nitride compound layer and the Ag concentration curve was divided by t/4 to obtain the average Ag concentration C2.

Here, regarding the interface of the ceramic substrate and the nitride compound layer, the position in which the concentration of the nitride forming element in the line analysis first reached 10 at % or more as viewed from the ceramic substrate side was set as the interface.

In a case where the ratio C2/C1 between the average Ag concentration C1 in the region from the interface close to the ceramic substrate in the nitride compound layer to a 25% thickness position of the total thickness and the average Ag concentration C2 in the region from the interface close to the copper plate to a 25% thickness position of the total thickness was small, the initial bonding rate was likely to be high and cracks in the ceramic substrate were likely to be suppressed. This is because it is assumed that Ag is sufficiently dispersed on the ceramic substrate side and the interface reaction proceeds.

From the above, according to Examples, it was confirmed that the copper-ceramic bonded body in which the copper member and the ceramic member formed of silicon nitride ($Si_3N_4$) were reliably bonded could be provided.

INDUSTRIAL APPLICABILITY

The copper-ceramic bonded body and the insulation circuit substrate of the present invention have high reliability and are suitable for a semiconductor device such as an LED or a power module since the copper member and the ceramic member which can suppress the generation of cracks in the nitride compound layer are reliably bonded.

REFERENCE SIGNS LIST 10, 110, 210: insulation circuit substrate
11: ceramic substrate
12, 112, 212: circuit layer (copper layer)
13, 113: metal layer
22, 122, 123, 222: copper plate
24: Ag—Cu—Ti-based brazing filler material
31: nitride compound layer
32: Ag—Cu eutectic layer
33: intermetallic compound phase
34: Cu and Si
35: Ag particle
124: Ag—Cu—Ti-based brazing filler material
224: Ag—Ti-based brazing filler material paste

What is claimed is:

1. A copper-ceramic bonded body comprising:
a copper member formed of copper or a copper alloy; and
a ceramic member formed of silicon nitride,
wherein the copper member and the ceramic member are bonded to form the copper-ceramic bonded body,
at a bonding interface of the copper member and the ceramic member, a nitride compound layer including one or more nitride forming elements selected from Ti, Nb, Hf, and Zr, and an Ag—Cu eutectic layer are formed in order from the ceramic member side,
a thickness of the nitride compound layer is 0.47 μm or more and 0.89 μm or less,
an intermetallic compound phase formed of an intermetallic compound that contains the nitride forming element and Si is present between the copper member and the ceramic member,
Cu and Si are present at a grain boundary of the nitride compound layer, and
wherein 90° peeling strength between the copper member and the ceramic member is 11.0 kN/m or more and 16.4 kN/m or less.

2. The copper-ceramic bonded body according to claim 1, wherein Ag particles are dispersed in the nitride compound layer.

3. The copper-ceramic bonded body according to claim 2, wherein a particle diameter of the Ag particles dispersed in the nitride compound layer is in a range of 10 nm or more and 100 nm or less.

4. The copper-ceramic bonded body according to claim 2, wherein a ratio C2/C1 is 0.8 or less, wherein,
C1 is an average Ag concentration in a region of the nitride compound layer from the interface with the ceramic member to a position 25% of a total thickness of the nitride compound layer, and
C2 is an average Ag concentration in a region of the nitride compound layer from the interface with the Ag—Cu eutectic layer to a position 25% of the total thickness of the nitride compound layer from the interface with the copper member.

5. An insulation circuit substrate comprising:
a copper layer formed of copper or a copper alloy; and
a ceramic substrate formed of silicon nitride,
wherein the copper layer is formed on a surface of the ceramic substrate, and
the copper layer and the ceramic substrate are formed of the copper-ceramic bonded body according to claim 1.

6. The copper-ceramic bonded body according to claim 3, wherein a ratio C2/C1 is 0.8 or less, wherein,
C1 is an average Ag concentration in a region of the nitride compound layer from the interface with the ceramic member to a position 25% of a total thickness of the nitride compound layer, and
C2 is an average Ag concentration in a region of the nitride compound layer from the interface with the Ag—Cu eutectic layer to a position 25% of the total thickness of the nitride compound layer from the interface with the copper member.

* * * * *